US012641833B2

(12) United States Patent
Guo et al.

(10) Patent No.: US 12,641,833 B2
(45) Date of Patent: May 26, 2026

(54) THIN FILM TRANSISTOR, MANUFACTURING METHOD THEREOF AND CIRCUIT

(71) Applicants: Beijing BOE Technology Development Co., Ltd., Beijing (CN); BOE TECHNOLOGY GROUP CO., LTD., Beijing (CN)

(72) Inventors: Wei Guo, Beijing (CN); Hu Meng, Beijing (CN)

(73) Assignees: Beijing BOE Technology Development Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 449 days.

(21) Appl. No.: 18/028,182

(22) PCT Filed: May 11, 2022

(86) PCT No.: PCT/CN2022/092111
§ 371 (c)(1),
(2) Date: Mar. 23, 2023

(87) PCT Pub. No.: WO2023/216124
PCT Pub. Date: Nov. 16, 2023

(65) Prior Publication Data
US 2024/0355931 A1 Oct. 24, 2024

(51) Int. Cl.
*H10D 30/67* (2025.01)
*H10D 30/01* (2025.01)
(Continued)

(52) U.S. Cl.
CPC ..... *H10D 30/6756* (2025.01); *H10D 30/0314* (2025.01); *H10D 30/0321* (2025.01);
(Continued)

(58) Field of Classification Search
CPC ........... H10D 30/6756; H10D 30/0314; H10D 30/0321; H10D 30/6713; H10D 30/6729;
(Continued)

(56) References Cited

U.S. PATENT DOCUMENTS

| | | | | |
|---|---|---|---|---|
| 7,051,945 B2 * | 5/2006 | Empedocles | .......... | H10D 30/43 257/14 |
| 7,135,728 B2 * | 11/2006 | Duan | ...................... | H01F 1/405 257/784 |

(Continued)

FOREIGN PATENT DOCUMENTS

| | | |
|---|---|---|
| CN | 104576744 A | 4/2015 |
| CN | 105280717 A | 1/2016 |

(Continued)

*Primary Examiner* — Eugene Lee
(74) *Attorney, Agent, or Firm* — HOUTTEMAN LAW LLC

(57) ABSTRACT

A thin film transistor includes: a substrate; a gate electrode; an active layer including a first active pattern and a second active pattern, where the first active pattern includes a first active sub-pattern, the first active sub-pattern comprises a first active region and a first source-drain contact region, the first source-drain contact region is connected to the second active pattern through the first active region, the first active pattern includes a material of at least one of a metal oxide semiconductor, low-temperature polycrystalline silicon, and amorphous silicon, and the second active pattern includes a material of a semiconductor carbon nanotube; a source electrode and a drain electrode spaced apart from each other and connected to the active layer; and a passivation layer on a side of the second active pattern distal to the substrate. A method for manufacturing the thin film transistor and a circuit are further provided.

20 Claims, 13 Drawing Sheets

(51) Int. Cl.
    *H10K 85/20*         (2023.01)
    *H10P 14/40*         (2026.01)

(52) U.S. Cl.
    CPC ..... *H10D 30/6713* (2025.01); *H10D 30/6729*
        (2025.01); *H10D 30/673* (2025.01); *H10D*
        *30/6739* (2025.01); *H10K 85/211* (2023.02);
        *H10P 14/40* (2026.01)

(58) Field of Classification Search
    CPC .............. H10D 30/673; H10D 30/6739; H01L
        21/449; H10K 85/211
    See application file for complete search history.

(56)         References Cited

U.S. PATENT DOCUMENTS

| | | | |
|---|---|---|---|
| 7,399,400 B2 * | 7/2008 | Soundarrajan ......... | G01N 27/02 |
| | | | 204/403.01 |
| 7,812,342 B2 * | 10/2010 | Lee ...................... | H10D 62/118 |
| | | | 257/40 |
| 8,003,453 B2 * | 8/2011 | Avouris ............... | H10D 62/121 |
| | | | 257/E21.046 |
| 8,154,011 B2 * | 4/2012 | Jiang .................... | H10K 10/484 |
| | | | 977/762 |
| 10,192,930 B2 * | 1/2019 | Zhao ...................... | H10K 19/10 |
| 2006/0038179 A1 * | 2/2006 | Afzali-Ardakani ......................... | |
| | | | H10K 10/466 |
| | | | 257/390 |
| 2010/0108988 A1 * | 5/2010 | Grebel ................... | B82Y 10/00 |
| | | | 174/126.1 |
| 2010/0252802 A1 * | 10/2010 | Numata ............... | G11C 13/025 |
| | | | 257/E29.068 |
| 2012/0326125 A1 * | 12/2012 | Guo ...................... | H10D 86/201 |
| | | | 438/758 |
| 2014/0332818 A1 * | 11/2014 | Liu ................... | H01L 21/02422 |
| | | | 257/75 |
| 2019/0013408 A1 * | 1/2019 | Xie .................... | H10D 30/6734 |
| 2019/0081259 A1 * | 3/2019 | Mao .................... | H10K 10/484 |
| 2020/0168741 A1 * | 5/2020 | Liu ...................... | H10K 59/124 |
| 2020/0251503 A1 * | 8/2020 | Zhang ................. | H10D 30/673 |
| 2020/0292489 A1 * | 9/2020 | Haque ............... | G01N 27/4145 |

FOREIGN PATENT DOCUMENTS

| | | |
|---|---|---|
| CN | 104716047 B | 8/2017 |
| CN | 107634102 A | 1/2018 |
| CN | 109817722 A | 5/2019 |
| CN | 111063731 A | 4/2020 |
| CN | 111081639 A | 4/2020 |

* cited by examiner

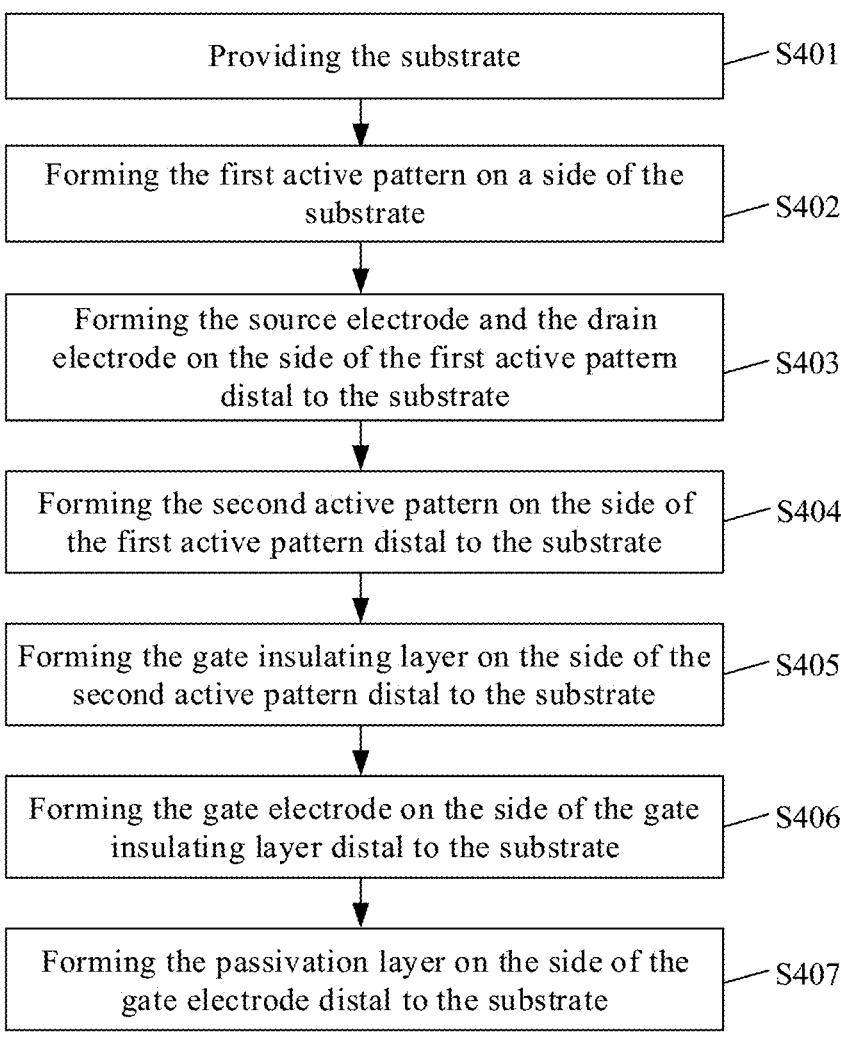

| Providing the substrate | S401 |

| Forming the first active pattern on a side of the substrate | S402 |

| Forming the source electrode and the drain electrode on the side of the first active pattern distal to the substrate | S403 |

| Forming the second active pattern on the side of the first active pattern distal to the substrate | S404 |

| Forming the gate insulating layer on the side of the second active pattern distal to the substrate | S405 |

| Forming the gate electrode on the side of the gate insulating layer distal to the substrate | S406 |

| Forming the passivation layer on the side of the gate electrode distal to the substrate | S407 |

FIG. 15

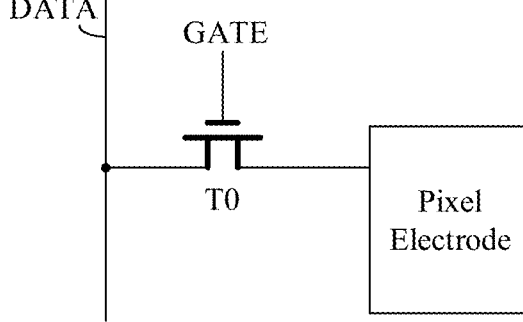

FIG. 16

THIN FILM TRANSISTOR, MANUFACTURING METHOD THEREOF AND CIRCUIT

CROSS REFERENCE TO RELATED APPLICATIONS

This is a National Phase Application filed under 35 U.S.C. 371 as a national stage of PCT/CN2022/092111 filed on May 11, 2022, the entire content of which is incorporated herein by reference.

TECHNICAL FIELD

The present disclosure relates to the field of transistor technology, and in particular, to a thin film transistor, a method for manufacturing the same, and a circuit.

BACKGROUND

In the current information society, with the continuous development of electronic technology, people spend more and more time on electronic devices, and a thin film transistor (TFT) is widely used as a basic component in a flat panel display, a flexible wearable electronic application, a sensing application, and the like. A conventional amorphous silicon TFT and a conventional low-temperature polycrystalline silicon TFT are increasingly difficult to meet the requirements of a modern application because the materials thereof each have a limited the mobility and cannot meet the requirement of flexibility. A metal oxide type TFT has the characteristics of high mobility and good transparency, but has a poor performance in a flexible application. A carbon nanotube (CNT) type TFT has great advantages in optical devices, such as a high mobility, a high stability and a high light transmittance, and has a great potential in flexible application. However, during an actual manufacturing process of the CNT-type TFT, an electron trapping center will be formed due to factors such as water and oxygen adsorption, resulting in a significant hysteresis problem, which limits practical applications of the CNT-type TFT.

SUMMARY

Embodiments of the present disclosure provide a thin film transistor, a method for manufacturing the same, and a circuit.

In a first aspect, embodiments of the present disclosure provide a thin film transistor, including:

a substrate;

a gate electrode;

an active layer including a first active pattern and a second active pattern, wherein the first active pattern includes a first active sub-pattern, the first active sub-pattern includes a first active region and a first source-drain contact region, the first source-drain contact region is connected to the second active pattern through the first active region, the first active pattern includes a material of at least one of a metal oxide semiconductor, low-temperature polycrystalline silicon, and amorphous silicon, and the second active pattern includes a material of a semiconductor carbon nanotube;

a source electrode and a drain electrode, which are spaced apart from each other and are respectively connected to the active layer; and a passivation layer on a side of the second active pattern distal to the substrate.

In some embodiments, the first active pattern further includes a second active sub-pattern spaced apart from the first active sub-pattern in a direction parallel to the substrate;

the second active sub-pattern includes a second active region and a second source-drain contact region, the first source-drain contact region is on a side of the first active region distal to the second active sub-pattern, the second source-drain contact region is on a side of the second active region distal to the first active sub-pattern, and the second source-drain contact region is connected to the second active pattern through the second active region; and one of the source electrode and the drain electrode is connected to the first source-drain contact region, and the other of the source electrode and the drain electrode is connected to the second source-drain contact region.

In some embodiments, the second active pattern includes a first portion between the first active region and the second active region;

the second active pattern further includes at least one of a second portion and a third portion which are connected to the first portion;

an orthogonal projection of the second portion on the substrate overlaps an orthogonal projection of the first active region on the substrate; and an orthogonal projection of the third portion on the substrate overlaps an orthogonal projection of the second active region on the substrate.

In some embodiments, an orthogonal projection of the second active pattern on the substrate does not overlap each of an orthogonal projection of the first source-drain contact region on the substrate and an orthogonal projection of the second source-drain contact region on the substrate.

In some embodiments, the second active pattern is on a side of the first active pattern distal to the substrate.

In some embodiments, the gate electrode is between the substrate and the active layer or on a side of the active layer distal to the substrate, and the gate electrode and the active layer have a gate insulating layer therebetween; and the source electrode and the drain electrode are on a side of the first active pattern distal to the substrate, or between the first active pattern and the substrate.

In some embodiments, one of the source electrode and the drain electrode is connected to the first source-drain contact region, and the other of the source electrode and the drain electrode is connected to the second active pattern.

In some embodiments, the substrate is a flexible substrate.

In some embodiments, the gate electrode includes a material of a metal nanomaterial, and/or each of the source electrode and the drain electrode includes a material of a metal nanomaterial.

In some embodiments, the semiconductor carbon nanotube has a diameter ranging from 0.8 nm to 2 nm.

In some embodiments, a hysteresis gap formed in a forward sweep and a reverse sweep performed on the thin film transistor is less than or equal to 0.2 V.

In some embodiments, a ratio of a source-drain current of the thin film transistor in a saturated turn-on state to a source-drain current of the thin film transistor in a turn-off state is greater than or equal to $10^5$.

In a second aspect, embodiments of the present disclosure further provide a method for manufacturing the thin film transistor according to any one of the embodiments of the first aspect, where the method includes:

providing the substrate;

forming the gate electrode;

forming the active layer, wherein the forming the active layer includes forming the first active pattern through a patterning process and forming the second active pattern through a patterning process, the first active pattern includes the first active sub-pattern, the first active sub-pattern includes the first active region and the first source-drain contact region, the first source-drain contact region is connected to the second active pattern through the first active region, the first active pattern includes the material of at least one of the metal oxide semiconductor, the low-temperature polycrystalline silicon, and the amorphous silicon, and the second active pattern includes the material of the semiconductor carbon nanotube;

forming the source electrode and the drain electrode, which are spaced apart from each other and are respectively connected to the active layer; and forming the passivation layer, which is on the side of the second active pattern distal to the substrate.

In some embodiments, the forming the second active pattern through the patterning process includes:

performing an ultrasonic dispersion on a semiconducting single-walled carbon nanotube solution in water to obtain a solution for dip-coating;

forming a semiconductor carbon nanotube film on a substrate to be processed through a dip-coating process; and etching the semiconductor carbon nanotube film to obtain the second active pattern.

In some embodiments, the semiconductor carbon nanotube film is etched by using an inductively coupled plasma etching process.

In some embodiments, the method further including, after the forming the semiconductor carbon nanotube film on the substrate to be processed through the dip-coating process and before the etching the semiconductor carbon nanotube film:

placing the substrate to be processed on which the semiconductor carbon nanotube film is formed in an oven for heat treatment to increase an adhesion between the semiconductor carbon nanotube film and another film in contact with the semiconductor carbon nanotube film.

In some embodiments, the forming the second active pattern through the patterning process is performed after the forming the first active pattern through the patterning process.

In some embodiments, the forming the gate electrode is performed before the forming the active layer, and the method further includes, between the forming the gate electrode and the forming the active layer: forming a gate insulating layer on a side of the gate electrode distal to the substrate; or, the forming the gate electrode is performed after the forming the active layer, and the method further includes, between the forming the active layer and the forming the gate electrode: forming a gate insulating layer on a side of the active layer distal to the substrate; and the forming the source electrode and the drain electrode is performed before or after the forming the first active pattern.

In some embodiments, the forming the source electrode and the drain electrode is performed before the forming the second active pattern through the patterning process.

In some embodiments, the substrate is a flexible substrate;

the forming the gate electrode includes: forming a pattern of the gate electrode by a process of ink-jet printing a metal nanomaterial; and/or the forming the source electrode and the drain electrode includes: forming a pattern of the source electrode and the drain electrode by a process of ink-jet printing a metal nanomaterial.

In a third aspect, embodiments of the present disclosure further provide a circuit, where the circuit includes at least one switch, and the at least one switch is the thin film transistor according to any one of the embodiments of the first aspect.

BRIEF DESCRIPTION OF THE DRAWINGS

FIG. 1b is a schematic cross-sectional view taken along a direction A-A' as shown in FIG. 1a;

FIG. 2b is a schematic cross-sectional view taken along a direction B-B' as shown in FIG. 2a;

FIG. 6 is another schematic cross-sectional view taken along the direction B-B' as shown in FIG. 2a;

FIG. 7 is still another schematic cross-sectional view taken along the direction B-B' as shown in FIG. 2a;

FIG. 8 is yet another schematic cross-sectional view taken along the direction B-B' as shown in FIG. 2a;

FIG. 9 is still another schematic cross-sectional view taken along the direction B-B' as shown in FIG. 2a;

FIG. 15 is a flowchart showing a method for manufacturing a thin film transistor according to an embodiment of the present disclosure;

FIG. 16 is a schematic diagram of a pixel circuit according to an embodiment of the present disclosure.

DETAILED DESCRIPTION OF EMBODIMENTS

To help one of ordinary skill in the art better understand technical solutions of the present disclosure, a thin film transistor, a method for manufacturing the thin film transistor, and a circuit provided by the present disclosure will be described in detail below with reference to the accompanying drawings.

The terms "first", "second", and the like used in embodiments of the present disclosure are not intended to indicate any order, quantity, or importance, but rather are used for distinguishing one element from another. Similarly, the term of "comprising", "including", or the like, means that the element or item preceding the term contains the element or item listed after the term and its equivalent, but does not exclude the presence of other elements or items. The term "coupled", "connected", or the like, is not limited to physical or mechanical couplings, but may include electrical couplings (i.e., electrical connections), whether direct or indirect couplings.

The expression that a structure A is located on a side of a structure B distal to (i.e., away from) a substrate in an embodiment of the present disclosure means that: orthogonal projections of the structures A and B on the substrate may have an overlapping region, and a distance between a portion of the structure A in the overlapping region and the substrate is greater than a distance between a portion of the structure B in the overlapping region and the substrate. In terms of manufacturing process, the above expression may intends that a material film forming process for manufacturing the structure A may be performed after a material film forming process for manufacturing the structure B.

The term "about" or "approximately" as used in an embodiment of the present disclosure includes a stated value itself, and is within an acceptable range of deviation for a particular quantity as determined by one of ordinary skill in the art in view of the measurement in question and an error associated with the measurement of the particular quantity (i.e., the limitations of a measurement system). For example, the term "about" or "approximately" may intend that a deviation of the stated value falls within one or more standard deviations, or within a range of ±30%, a range of ±20%, a range of ±10%, or a range of ±5% of the stated value.

Further, the expression of a range from M to N in an embodiment of the present disclosure means that the defined range includes the two endpoints of M and N.

Figure 1A:
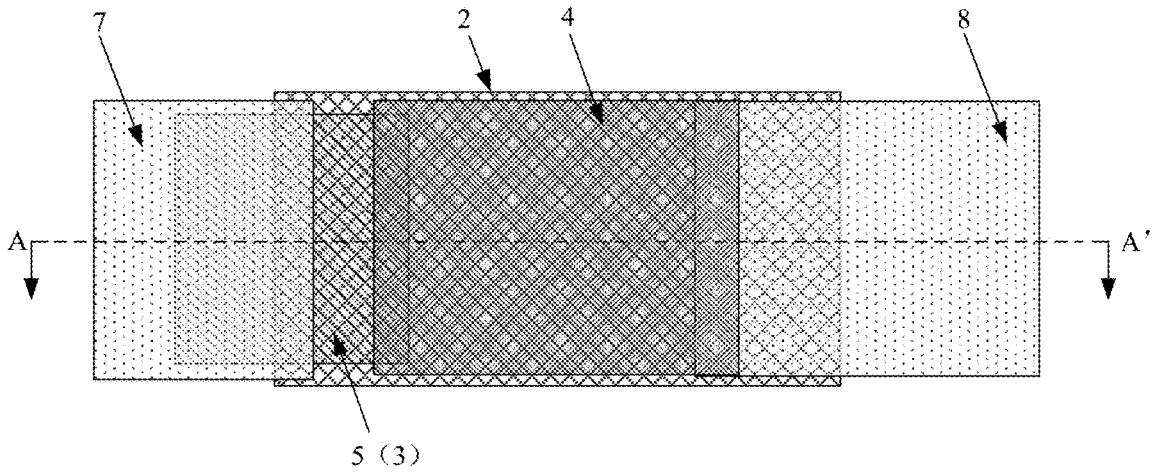
FIG. 1a is a schematic top view of a thin film transistor according to an embodiment of the present disclosure.
Figure 1B:
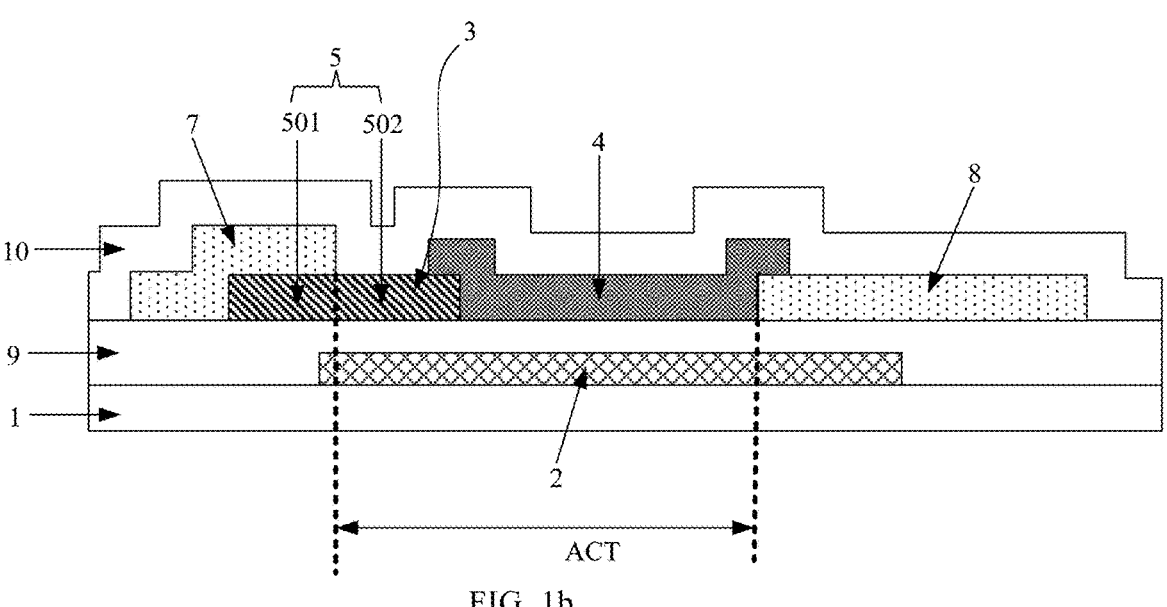
Figure 2A:
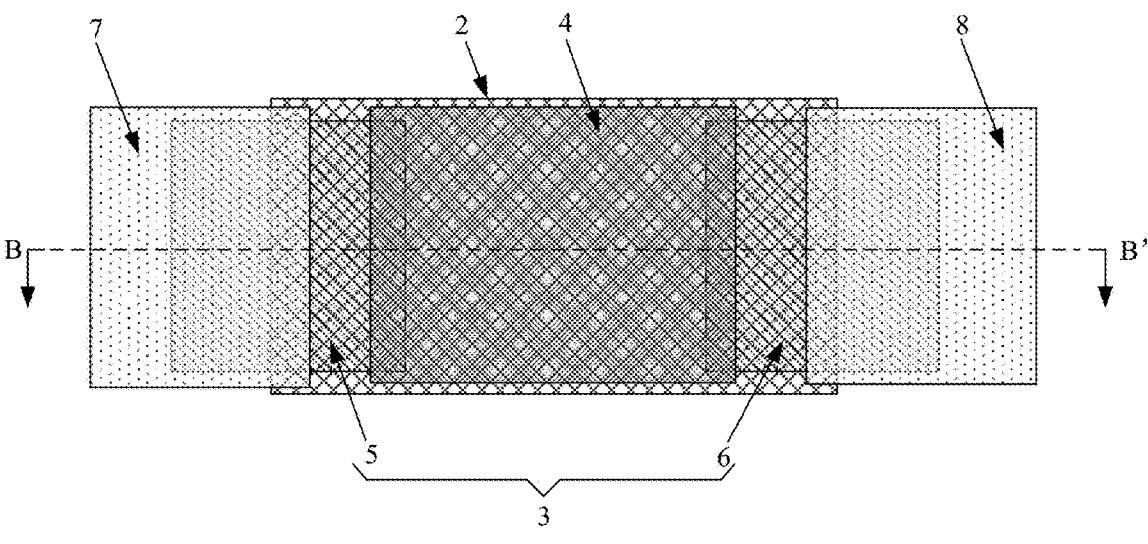
FIG. 2a is a schematic top view of a thin film transistor according to an embodiment of the present disclosure.
Figure 2B:
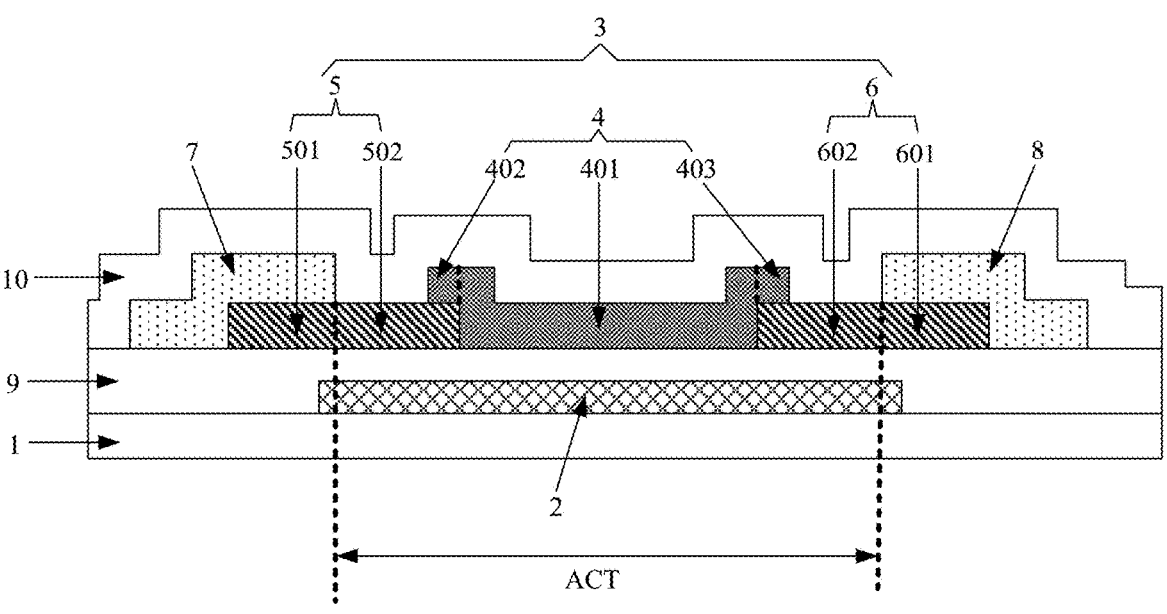

FIG. 1a is a schematic top view of a thin film transistor according to an embodiment of the present disclosure, and FIG. 1b is a schematic cross-sectional view taken along a direction A-A' as shown in FIG. 1a. FIG. 2a is a schematic top view of a thin film transistor according to an embodiment of the present disclosure, and FIG. 2b is a schematic cross-sectional view taken along a direction B-B' as shown in FIG. 2a. As shown in FIGS. 1a to 2b, the TFT includes: a substrate 1, a gate electrode 2, an active layer, a source electrode 7, a drain electrode 8, and a passivation layer 10.

The substrate 1 may be a flexible substrate (e.g., a resin substrate) or a rigid substrate (e.g., a glass substrate).

The active layer includes a first active pattern 3 and a second active pattern 4. The first active pattern 3 includes a first active sub-pattern 5 including a first active region 502 and a first source-drain contact region 501, and the first source-drain contact region 501 is connected to the second active pattern 4 through the first active region 502. A material of the first active pattern 3 includes at least one of a metal oxide semiconductor, low-temperature polycrystalline silicon and amorphous silicon, and a material of the second active pattern 4 includes a semiconductor carbon nanotube (which may also be referred to as a semiconducting carbon nanotube).

The source electrode 7 and the drain electrode 8 are spaced apart from each other and are respectively connected to the active layer.

The passivation layer 10 is positioned on a side of the second active pattern 4 distal to the substrate 1. The passivation layer 10 plays a role of isolating water and oxygen from the interior of the TFT, which can effectively and even completely solve the hysteresis problem of the TFT. The passivation layer 10 may be made of an organic material (e.g., polymethyl methacrylate, PMMA) or an inorganic material (e.g., $Al_2O_3$).

It should be noted that in an embodiment of the present disclosure, the source-drain contact region of the active sub-pattern refers to a region for contacting with the source electrode 7 or the drain electrode 8, and the active region refers to a region, which can be used as a channel portion of a thin film transistor, of the active sub-pattern.

Preferably, if the substrate 1 is a flexible substrate, in order to ensure that the active layer of the thin film transistor on the flexible substrate is still isolated from water and oxygen effectively, a material of the passivation layer 10 includes PMMA, and in particular, the material of the passivation layer 10 may be PMMA. In this case, a thickness of a layer of PMMA may be greater than or equal to 5 nm, and preferably, greater than or equal to 100 nm for better sealing effect.

A technical principle of the present disclosure will be described in detail below.

Figure 3A:
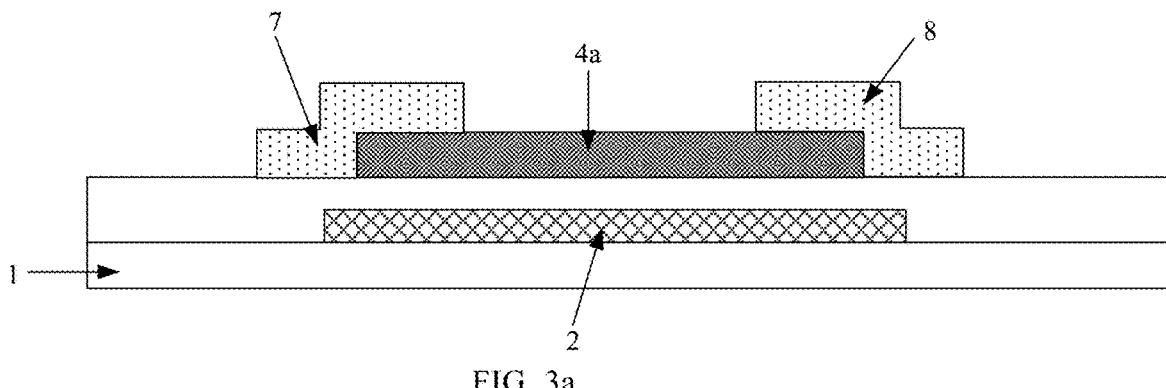
FIG. 3a is a schematic cross-sectional view of a CNT-type TFT in the related art.
Figure 3B:
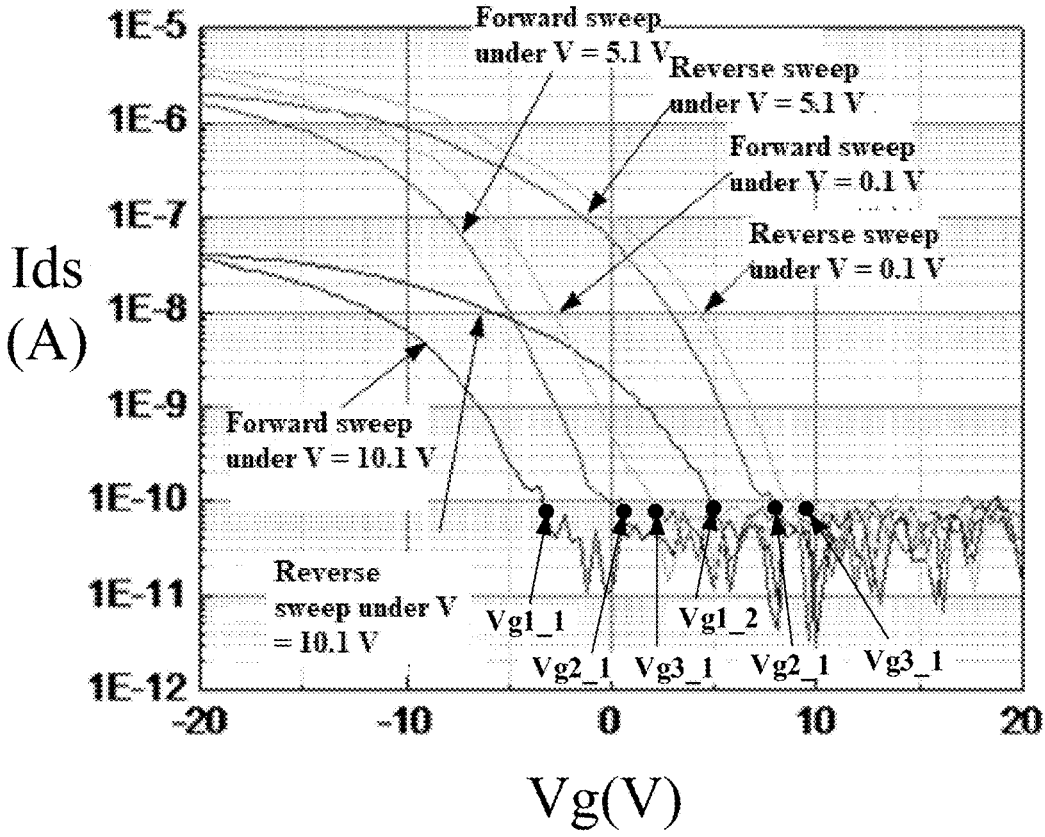
FIG. 3b is a schematic graph showing curves of relationship between gate voltages Vg and drain-source currents Ids respectively corresponding to a forward sweep and a reverse sweep performed on the CNT-type TFT in the related art.

FIG. 3a is a schematic cross-sectional view of a CNT-type TFT in the related art, and FIG. 3b is a schematic graph showing curves of relationship between gate voltages Vg and drain-source currents Ids respectively corresponding to a forward sweep and a reverse sweep performed on the CNT-type TFT in the related art. As shown in FIGS. 3a and 3b, a conventional CNT-type TFT includes a gate electrode 2, an active layer 4a, a source electrode 7, and a drain electrode 8, where a material of the active layer 4a includes a semiconductor carbon nanotube.

The inventors of the present inventive concept have found that in the conventional CNT-type TFT, an electron trapping center is formed, and thus electrons may be bound by the electron trapping center. In this case, under the condition that a drain-source voltage Vds is fixed (e.g., tests are performed with Vds fixed at 0.1V, fixed at 5.1V, and fixed at 10.1V, respectively), a concentration of holes in the CNT-type TFT when being subjected to a reverse sweep (i.e., a process of adjusting a voltage Vg at the gate electrode of the CNT-type TFT from a high one to a low one, for example, a process of gradually adjusting the voltage Vg at the gate electrode from 20 V to −20 V in FIG. 3b) is greater than a concentration of holes in the CNT-type TFT when being subjected to a forward sweep (i.e., a process of adjusting the voltage Vg at the gate electrode of the CNT-type TFT from a low one to a high one, for example, a process of gradually adjusting the voltage Vg at the gate electrode from −20 V to 20 V in FIG. 3b), and a threshold voltage exhibited by the CNT-type TFT in the reverse sweep is shifted to the right relative to a threshold voltage exhibited by the CNT-type TFT in the forward sweep, resulting in a Vg-Ids curve of the reverse sweep not coinciding with a Vg-Ids curve of the forward sweep, and a large hysteresis gap in electric current.

A current hysteresis phenomenon may be considered as a dependency of the threshold voltage on a direction in which the voltage at the gate electrode is swept (or scanned), i.e., the threshold voltage in the forward sweep is different from the threshold voltage in the reverse sweep. In general, the current hysteresis phenomenon is quantitatively characterized by using the hysteresis gap. A value of the hysteresis gap $\Delta$Vth is an absolute value of a difference between a threshold voltage Vth_f obtained from the Vg-Ids curve of the forward sweep and a threshold voltage Vth_r obtained from the Vg-Ids curve of the reverse sweep, and may be represented as follows:

$$\Delta Vth = |Vth\_f - Vth\_r|,$$

where the larger the hysteresis gap $\Delta$Vth is, the more serious the current hysteresis phenomenon is.

When the drain-source voltage Vds is 10.1 V, it can be derived from the curves shown in FIG. 3$b$ that the hysteresis gap $\Delta$Vth is about Vg1_2–Vg1_1=4.9 V–(−3.8 V)=8.7 V. When the drain-source voltage Vds is 5.1 V, it can be derived from the curves shown in FIG. 3$b$ that the hysteresis gap $\Delta$Vth is about Vg2_2–Vg2_1=7.8 V–0.4 V=7.4 V. When the drain-source voltage Vds is 0.1 V, it can be derived from the curves shown in FIG. 3$b$ that the hysteresis gap $\Delta$Vth is about Vg3_2–Vg3_1=9.5 V–2.1 V=7.4 V.

Figure 4:
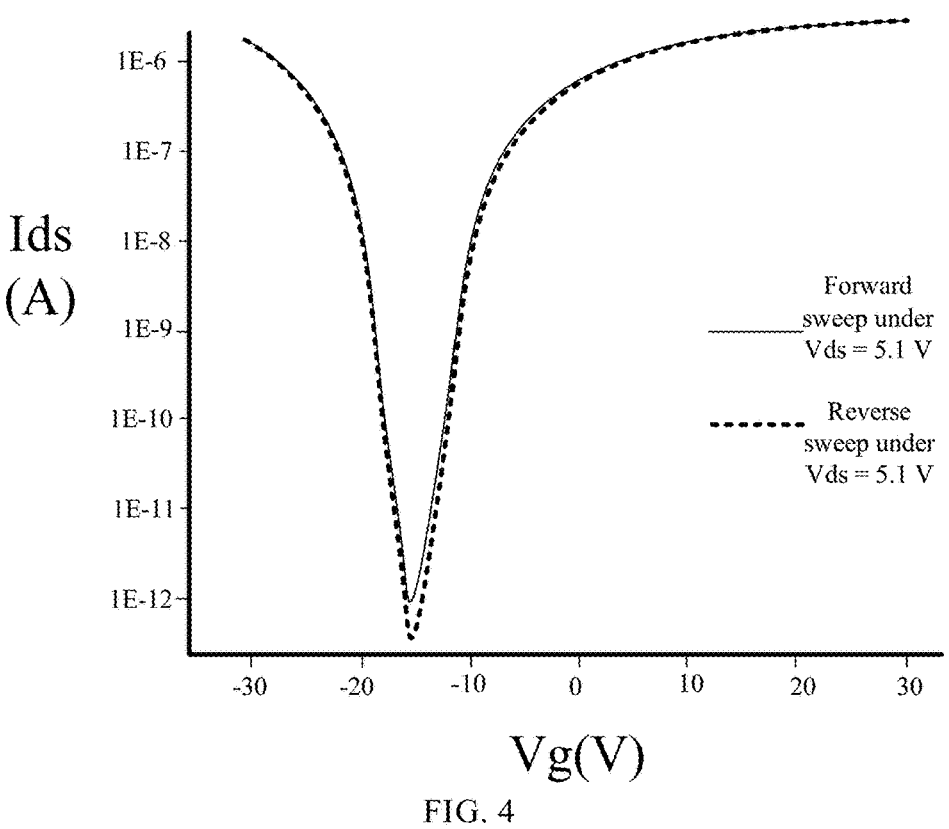
FIG. 4 is a schematic graph showing curves of relationship between gate voltages Vg and drain-source currents Ids respectively corresponding to a forward sweep and a reverse sweep performed on a CNT-type TFT after a passivation layer for isolating water and oxygen from the CNT is disposed on a surface of the CNT-type TFT.

It has been found through researches that the hysteresis problem of the CNT-type TFT in the related art may be effectively solve or even completely eliminated by disposing a passivation layer for isolating water and oxygen from the CNT on a surface of the CNT-type TFT in the related art. FIG. 4 is a schematic graph showing curves of relationship between gate voltages Vg and drain-source currents Ids respectively corresponding to a forward sweep and a reverse sweep performed on the CNT-type TFT after the passivation layer for isolating water and oxygen from the CNT is disposed on the surface of the CNT-type TFT. As shown in FIG. 4, taking the case of the source-drain voltage Vds=5.1 V as an example, after the passivation layer for isolating water and oxygen from the CNT is disposed on the surface of the CNT, Vg-Ids curves corresponding to the forward sweep and the reverse sweep performed on the CNT-type TFT substantially coincide with each other. That is, the disposition of the passivation layer can effectively solve the hysteresis problem of the CNT-type TFT.

However, as can be seen from FIG. 4, after the passivation layer is provided, although the passivation layer can block water and oxygen, but the passivation layer simultaneously blocks the injection of holes. Thus, the CNT-type TFT in the related art exhibits a bipolar characteristic, i.e., the CNT-type TFT exhibits a high conductivity (i.e., the current Ids is large) under both a forward bias voltage and a reverse bias voltage, and thus the CNT-type TFT device cannot exhibit the characteristics of "switching".

Based on the above researches, the present disclosure provides a novel CNT-type TFT. Specifically, referring to FIGS. 1$a$ and 1$b$, the active layer of the CNT-type TFT is designed as a composite structure, which includes the first active pattern 3 and the second active pattern 4, and the first active pattern 3 includes the first active sub-pattern 5, where the first active sub-pattern 5 includes the first active region 502 and the first source-drain contact region 501, and the first source-drain contact region 501 is connected to the second active pattern 4 through the first active region 502. Further, the material of the first active pattern 3 includes at least one of a metal oxide semiconductor, low temperature polysilicon, and amorphous silicon, and the material of the second active pattern 4 includes a semiconductor carbon nanotube.

Referring to FIGS. 1$a$ and 1$b$, from the left to the right of the semiconductor layer as a whole, there are provided the first source-drain contact region 501, the first active region 502, a semiconductor carbon nanotube active region (i.e., a portion of the second active pattern 4 between the first active region 502 and the drain electrode 8). In this case, the first active region 502 and the semiconductor carbon nanotube active region together form (e.g., constitute) the overall active region ACT of the active layer. When the first active region 502 has an N-type semiconductor characteristic (e.g., doping a semiconductor material with donor impurities, which is also referred to as N-type doping), the first active region 502 can effectively reduce the conductivity of the TFT under a reverse bias voltage, i.e., the entire active region ACT of the active layer has an N-type semiconductor characteristic, and accordingly the TFT is an N-type TFT, which is turned on under the action of a forward bias voltage and turned off under the action of a reverse bias voltage. When the first active region 502 has a P-type semiconductor characteristic (e.g., doping acceptor impurities in the semiconductor material, which is also referred to as P-type doping), the first active region 502 can effectively reduce the conductivity of the TFT under a forward bias voltage, i.e., the entire active region ACT of the active layer has a P-type semiconductor characteristic, and accordingly the TFT is a P-type TFT, which is turned on under the action of a reverse bias voltage and turned off under the action of a forward bias voltage. It can be seen that the TFT provided by the present embodiment has the characteristics of "switching".

Meanwhile, in the active layer, due to the existence of the semiconductor carbon nanotube active region, the carrier mobility and the stability of the whole active layer can be effectively improved, and the TFT is suitable for flexible application scenes.

Referring to FIGS. 1$a$ and 1$b$, in some embodiments, one of the source electrode 7 and the drain electrode 8 is connected to the first source-drain contact region 501, and the other of the source electrode 7 and the drain electrode 8 is connected to the second active pattern 4.

Referring to FIGS. 2$a$ and 2$b$, in other embodiments, the first active pattern 3 includes not only the first active sub-pattern 5 described above, but also a second active sub-pattern 6. The second active sub-pattern 6 and the first active sub-pattern 5 are spaced apart from each other along a direction parallel to the substrate 1. The second active sub-pattern 6 includes a second active region 602 and a second source-drain contact region 601. The first source-drain contact region 501 is located on a side of the first active region 502 distal to the second active sub-pattern 6, and the second source-drain contact region 601 is located on a side of the second active region 602 distal to the first active sub-pattern 5. The second source-drain contact region 601 is connected to the second active pattern 4 through the second active region 602. One of the source electrode 7 and the drain electrode 8 is connected to the first source-drain contact region 501, and the other of the source electrode 7 and the drain electrode 8 is connected to the second source-drain contact region 601.

Referring to FIGS. 2$a$ and 2$b$, from the left to the right of the semiconductor layer as a whole, there are provided the first source-drain contact region 501, the first active region 502, a semiconductor carbon nanotube active region (i.e., a portion of the second active pattern 4 between the first active region 502 and the second active region 602), the second active region 602, and the second source-drain contact region 601. In this case, the first active region 502, the semiconductor carbon nanotube active region, and the second active region 602 together form (e.g., constitute) an overall active region ACT of the active layer. When the first active region 502 and the second active region 602 each have N-type semiconductor characteristics, the first active region 502 and the second active region 602 can effectively reduce the conductivity of the TFT under a reverse bias voltage, i.e., the entire active region ACT of the active layer has N-type semiconductor characteristics, and accordingly the TFT is an N-type TFT, which is turned on under the action of a forward bias voltage and turned off under the action of a reverse bias voltage. When the first active region 502 and the second active region 602 each have P-type semiconductor characteristics, the first active region 502 and the second active region 602 can effectively reduce the conductivity of the TFT under a forward bias voltage, i.e., the entire active region ACT of the active layer has P-type semiconductor characteristics, and accordingly, the TFT is a P-type TFT, which is turned on under the action of a reverse bias voltage and turned off under the action of a forward bias voltage. It can be seen that the TFT provided by the present embodiment has the characteristics of "switching".

As an example, as shown in FIGS. 1a to 2b, the material of the first active pattern 3 includes a metal oxide semiconductor, which is generally doped to be N-type, such that the entire active region ACT of the active layer exhibits N-type semiconductor characteristics, and the TFT is an N-type TFT.

As another example, as shown in FIGS. 1a to 2b, the material of the first active pattern 3 includes low temperature polysilicon or amorphous silicon, and the low temperature polysilicon and the amorphous silicon are generally each subjected to P-type doping, such that the entire active region ACT of the active layer exhibits P-type semiconductor characteristics, and the TFT is a P-type TFT.

Specifically, the semiconductor carbon nanotube may be a semiconducting single-walled carbon nanotube.

Figure 5:
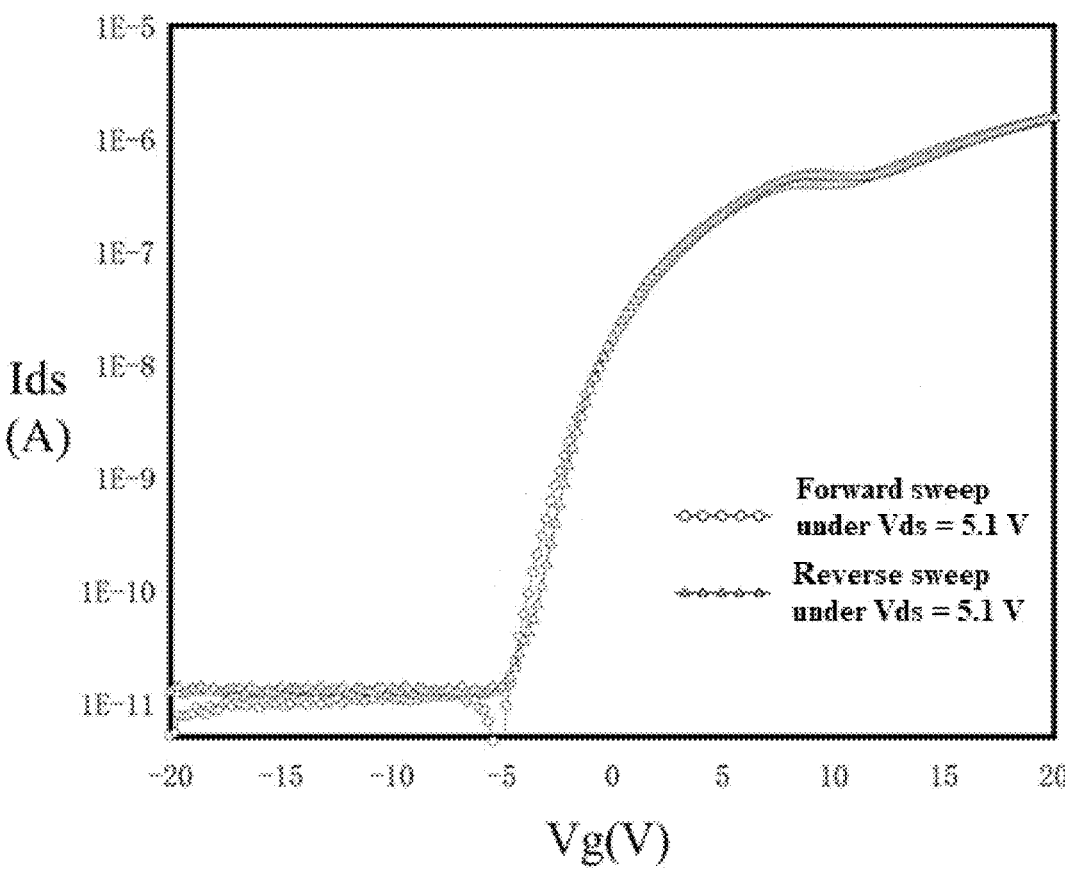
FIG. 5 is a schematic graph showing curves of relationship between gate voltages Vg and drain-source currents Ids respectively corresponding to a forward sweep and a reverse sweep performed on a CNT-type TFT according to an embodiment of the present disclosure.

FIG. 5 is a schematic graph showing curves of relationship between voltages Vg at the gate electrode 2 and drain-source currents Ids respectively corresponding to a forward sweep and a reverse sweep performed on a CNT-type TFT according to an embodiment of the present disclosure. As shown in FIG. 5, the material of the first active pattern is IGZO and subjected to N-type doping, the material of the second active pattern is a semiconductor carbon nanotube with a diameter ranging from 0.8 nm to 2 nm and a thickness of 20 nm, a width of a channel of the TFT is 50 um, a length of the channel of the TFT is 50 um, and the passivation layer is made of a material of $Al_3O_2$ and has a thickness of 200 nm.

Taking the case of the source-drain voltage Vds=5.1 V as an example, the Vg-Ids curves corresponding to forward sweep and reverse sweep performed on the TFT substantially coincide with each other (i.e., the hysteresis gap ΔVth thereof is approximately equal to 0 V). Further, the TFT has a significant drain-source current Ids under a forward bias voltage, i.e., the TFT is in a turn-on state, and the TFT has a very small source-drain current under a reverse bias voltage, i.e., the TFT is in a turn-off state (i.e., this "very small source-drain current" is substantially a leakage current of the TFT in the turn-off state). By tests and comparisons, the source-drain current Ids of the TFT in a saturated turn-on state is about $10^6$ times as large as the source-drain current Ids of the TFT in the turn-off state. That is, the TFT has the characteristics of "switching" and can serve as a switch.

In some embodiments, an orthogonal projection of the second active pattern 4 on the substrate 1 does not overlap each of an orthogonal projection of the first source-drain contact region 501 on the substrate 1 and an orthogonal projection of the second source-drain contact region 601 on the substrate 1.

In some embodiments, the semiconductor carbon nanotube has a diameter ranging from 0.8 nm to 2 nm, and for example, the diameter may be equal to 0.8 nm, 1 nm, 1.55 nm, 1.8 nm, or 2 nm.

In some embodiments, a hysteresis gap less than or equal to 0.2 V is formed in a forward sweep and a reverse sweep performed on the thin film transistor.

In some embodiments, a ratio of the source-drain current of the thin film transistor in the saturated turn-on state to the source-drain current of the thin film transistor in the turn-off state is greater than or equal to $10^5$, to ensure that the thin film transistor has the characteristics of "switching" and can serve as a switch.

In some embodiments, the second active pattern 4 includes a first portion 401 between the first active region 502 and the second active region 602, and both ends of the first portion 401 are connected to the first active region 502 and the second active region 602, respectively.

In some embodiments, the second active pattern 4 further includes a second portion 402 and a third portion 403 which are connected to the first portion 401. An orthogonal projection of the second portion 402 on the substrate 1 overlaps an orthogonal projection of the first active region 502 on the substrate 1, and an orthogonal projection of the third portion 403 on the substrate 1 overlaps an orthogonal projection of the second active region 602 on the substrate 1.

In the present disclosure, by providing the second portion 402 extending onto the first active region 502 and the third portion 403 extending onto the second active region 602, the connection reliability of the second active pattern 4 with the first active region 502 and the second active region 602 can be effectively improved. Meanwhile, the provision of the second portion 402 and the third portion 403 can also improve an alignment error between the second active pattern 4 and the first active pattern 3 in a production process, which is beneficial to improving a rate of qualified product.

It should be noted that in an embodiment of the present disclosure, only the second portion 402 and no third portion 403 may be provided, or only the third portion 403 and no second portion 402 may be provided.

Apparently, the case where the second active pattern 4 includes the second portion 402 and/or the third portion 403 is only an optional implementation according to an embodiment of the present disclosure, and does not intend to limit a technical solution of the present disclosure. In the practice of the present disclosure, it is only necessary to ensure that the second active pattern 4 includes at least the first portion 401 described above.

Figure 6:
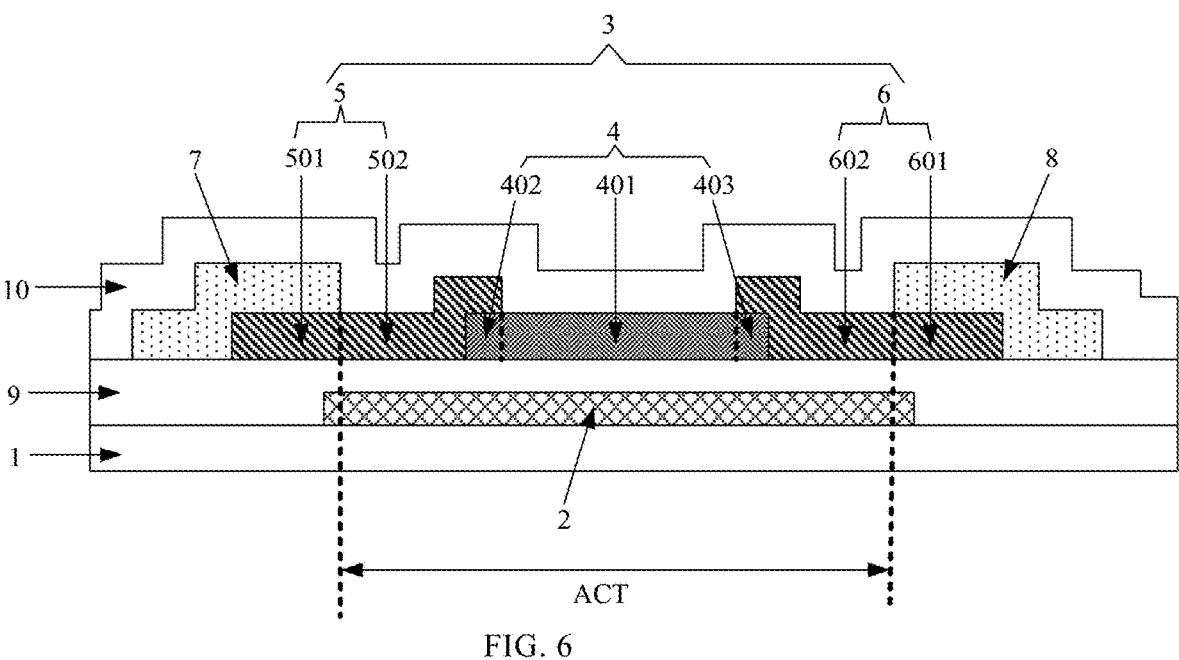

FIG. 6 is another schematic cross-sectional view taken along the direction B-B' as shown in FIG. 2a. As shown in FIG. 6, unlike the case where the second active pattern 4 is positioned on a side of the first active pattern 3 distal to the substrate 1 as shown in FIG. 2b, the case where the first active pattern 3 is positioned on a side of the second active pattern 4 distal to the substrate 1 is shown in FIG. 6.

However, it is found in a practical application that during a process of forming the first active pattern 3 shown in FIG.

6, an etching process (which is generally a dry etching process) is required to pattern a semiconductor thin film for forming the first active pattern 3, and since the second active pattern 4 has been formed, the semiconductor carbon nanotube below the first active pattern 3 is easily damaged during the etching process for the first active pattern 3, which affects the topography and electrical characteristics of the first active pattern 3.

Therefore, in the present embodiment, it is preferable to dispose the second active pattern 4 on the side of the first active pattern 3 distal to the substrate 1, such that the manufacturing process of the second active pattern 4 is performed after the manufacturing process of the first active pattern 3, thereby avoiding the above problems.

Apparently, it is within the scope of the present disclosure to dispose the first active pattern 3 on the side of the second active pattern 4 distal to the substrate 1 as shown in FIG. 6.

In some embodiments, the thin film transistor further includes the gate electrode 2, the source electrode 7 and the drain electrode 8. A gate insulating layer 9 is formed between the gate electrode 2 and the active layer. One of the source electrode 7 and the drain electrode 8 is connected to the first source-drain contact region 501, and the other of the source electrode 7 and the drain electrode 8 is connected to the second source-drain contact region 601.

FIGS. 2b and 6 exemplarily show the case where the gate electrode 2 and the gate insulating layer 9 are positioned between the substrate 1 and the active layer, and the source electrode 7 and the drain electrode 8 are positioned on the side of the first active pattern 3 distal to the substrate 1.

Figure 7:
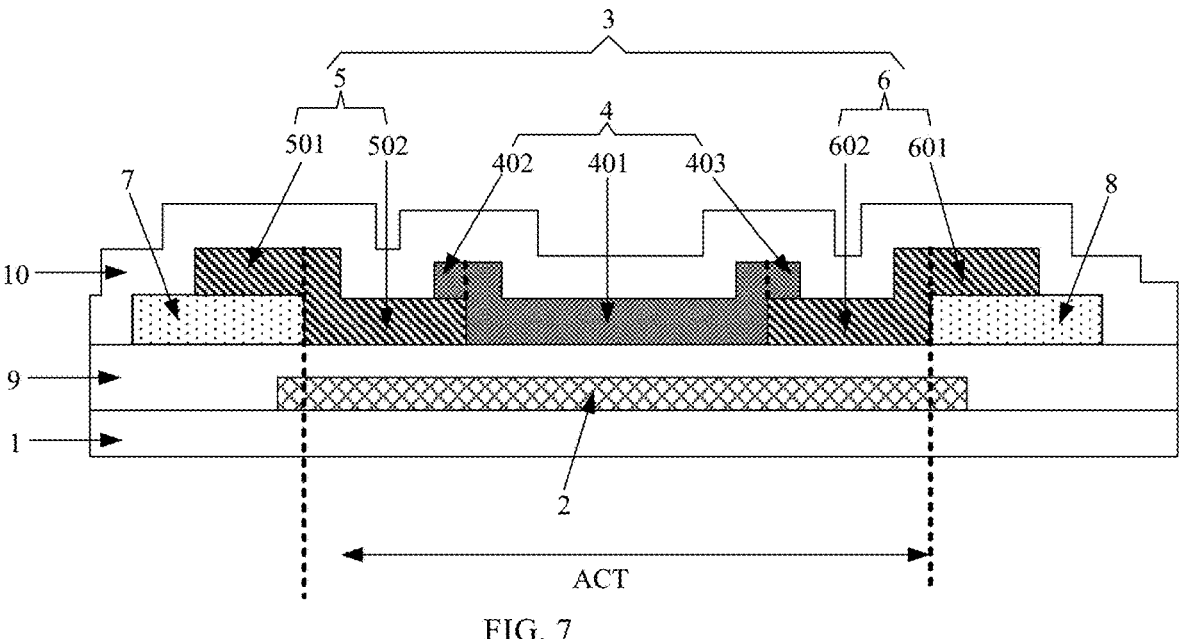

FIG. 7 is still another schematic cross-sectional view taken along the direction B-B' as shown in FIG. 2a. As shown in FIG. 7, unlike the foregoing embodiments, the gate electrode 2 and the gate insulating layer 9 are positioned between the substrate 1 and the active layer, and the source electrode 7 and the drain electrode 8 are positioned between the first active pattern 3 and the substrate 1, in the TFT shown in FIG. 7.

Figure 8:
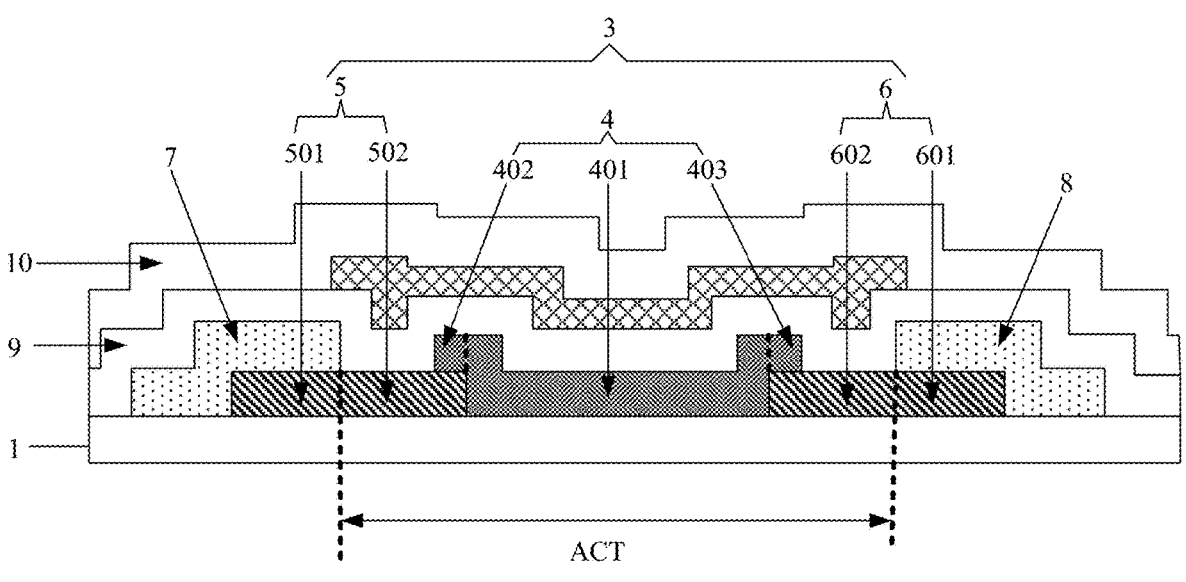

FIG. 8 is yet another schematic cross-sectional view taken along the direction B-B' as shown in FIG. 2a. As shown in FIG. 8, unlike the foregoing embodiments, the gate electrode 2 and the gate insulating layer 9 are positioned between the active layer and the passivation layer 10, and the source electrode 7 and the drain electrode 8 are positioned on the side of the first active pattern 3 distal to the substrate 1, in the TFT shown in FIG. 8.

Figure 9:
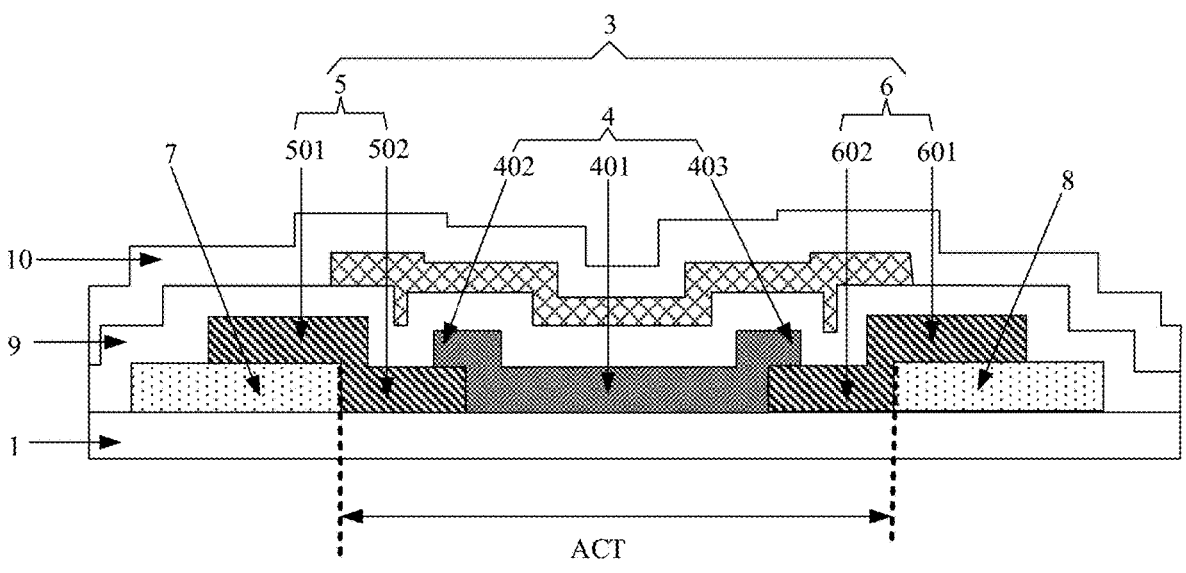

FIG. 9 is still another schematic cross-sectional view taken along the direction B-B' as shown in FIG. 2a. As shown in FIG. 9, unlike the foregoing embodiments, the gate electrode 2 and the gate insulating layer 9 are positioned between the active layer and the passivation layer 10, and the source electrode 7 and the drain electrode 8 are positioned between the first active pattern 3 and the substrate 1, in the TFT shown in FIG. 9.

Alternatively, in the cases shown in FIGS. 7 to 9, the first active pattern 3 may be disposed on the side of the second active pattern 4 distal to the substrate 1, and such cases should also fall within the scope of the present disclosure.

In addition, an embodiment in which the second active sub-pattern 6 shown in FIGS. 7 to 9 is removed and the drain electrode 8 shown in FIGS. 7 to 9 is directly connected to the second active pattern 4 (no corresponding figure is given) also falls within the scope of the present disclosure.

In some embodiments, the substrate 1 is a flexible substrate 1, the material of the gate electrode 2 includes a metal nanomaterial (i.e., a metal nanometer material), and the material of each of the source electrode 7 and the drain electrode 8 includes a metal nanomaterial. In an embodiment of the present disclosure, when the substrate 1 is a flexible substrate 1, it indicates that the TFT is applied to a flexible scene, and in this case, each of the gate electrode 2, the source electrode 7, and the drain electrode 8 is made of the metal nanomaterial with a better malleability, which can be better adapted to the flexible scene.

Alternatively, in an embodiment of the present disclosure, each of the gate electrode 2, the source electrode 7, and the drain electrode 8 may be made of a conventional metal material, such as molybdenum, aluminum, or the like.

Figure 10:
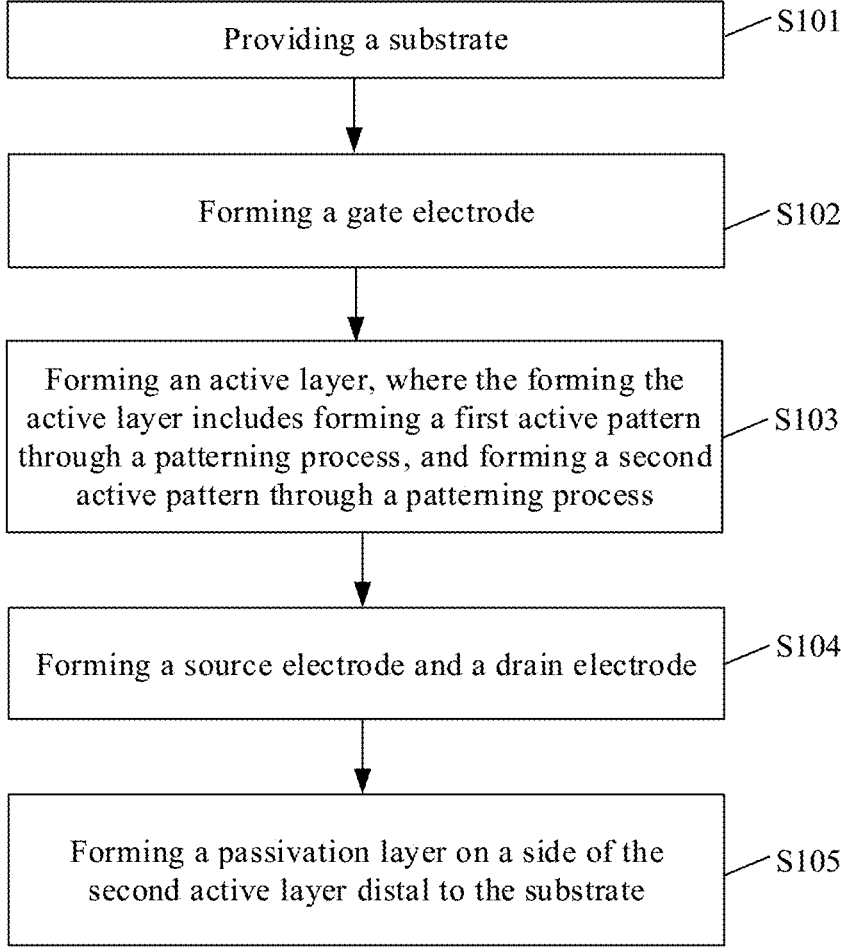
FIG. 10 is a flowchart showing a method for manufacturing a thin film transistor according to an embodiment of the present disclosure.

Based on the same inventive concept, an embodiment of the present disclosure also provides a method for manufacturing a thin film transistor. FIG. 10 is a flowchart showing a method for manufacturing a thin film transistor according to an embodiment of the present disclosure. As shown in FIG. 10, the manufacturing method may be used for manufacturing the thin film transistor according to any one of the foregoing embodiments, and may include the following steps S101 to S105.

Step S101 includes providing a substrate.

Step S102 includes forming a gate electrode.

Step S103 includes forming an active layer, where the forming an active layer includes forming a first active pattern through a patterning process, and forming a second active pattern through a patterning process.

Here, the first active pattern includes the first active sub-pattern including the first active region and the first source-drain contact region, and the first source-drain contact region is connected to the second active pattern through the first active region. Further, the first active pattern is made of at least one of a metal oxide semiconductor, low-temperature polycrystalline silicon and amorphous silicon, and the second active pattern is made of a semiconductor carbon nanotube.

Step S104 includes forming a source electrode and a drain electrode.

Step S105 includes forming a passivation layer on a side of the second active pattern distal to the substrate.

In an embodiment of the present disclosure, the patterning process includes a conventional patterning process and a non-conventional patterning process. The conventional patterning process is a patterning process based on a mask, and generally includes: forming a material film firstly, and then patterning the material film through a patterning process to obtain a corresponding pattern. Here, there are various methods for forming a thin film, such as deposition, coating, sputtering, etc., and the patterning process generally includes processes of photoresist coating, exposing, developing, etching, photoresist stripping, and the like. The non-conventional patterning process may not require a mask for patterning, and for example, may be a lifting-off process, a mimeographing process, a printing process, or the like. In an embodiment of the present disclosure, the patterning process may be a process which can form a desired pattern.

It should be noted that an execution sequence of the step S102, the step S103, and the step S104 is not limited in an embodiment of the present disclosure, which will be described in detail below with reference to specific examples.

In some embodiments, the first active pattern further includes the second active sub-pattern, and the second active sub-pattern and the first active sub-pattern are spaced apart from each other along the direction parallel to the substrate. The second active sub-pattern includes the second active region and the second source-drain contact region. The first source-drain contact region is located on the side of the first active region distal to the second active sub-pattern, and the second source-drain contact region is located on the side of the second active region distal to the first active sub-pattern. The second source-drain contact region is connected to the second active pattern through the second active region. One of the source electrode and the drain electrode is connected to the first source-drain contact region, and the other of the source electrode and the drain electrode is connected to the second source-drain contact region.

In some embodiments, the orthogonal projection of the second active pattern on the substrate does not overlap each of the orthogonal projection of the first source-drain contact region on the substrate and the orthogonal projection of the second source-drain contact region on the substrate.

Figure 11:
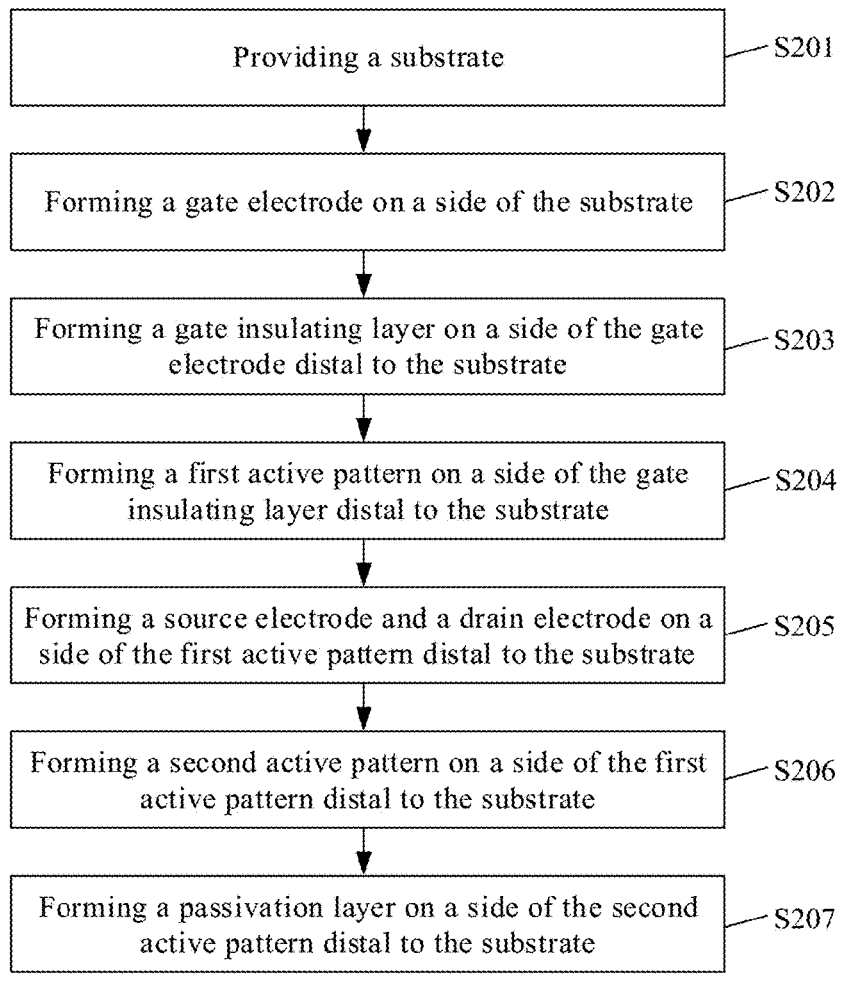
FIG. 11 is a flowchart showing a method for manufacturing a thin film transistor according to an embodiment of the present disclosure.
Figure 12A:
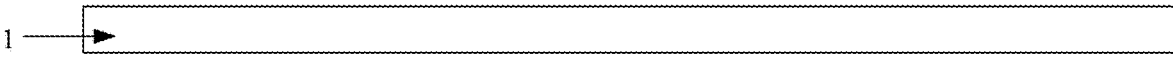
FIGS. 12a to 12f are schematic cross-sectional views showing intermediate products manufactured by the manufacturing method shown in FIG. 11.
Figure 12B:
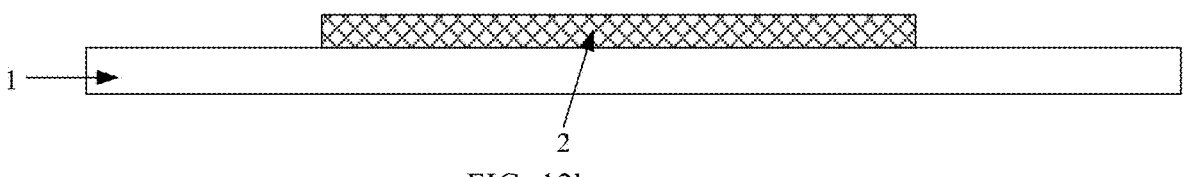
Figure 12C:
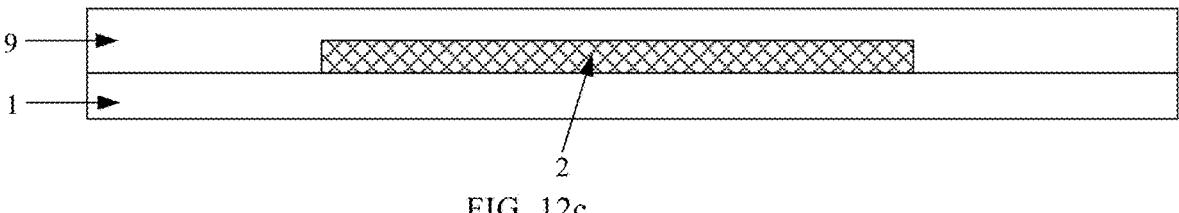
Figure 12D:
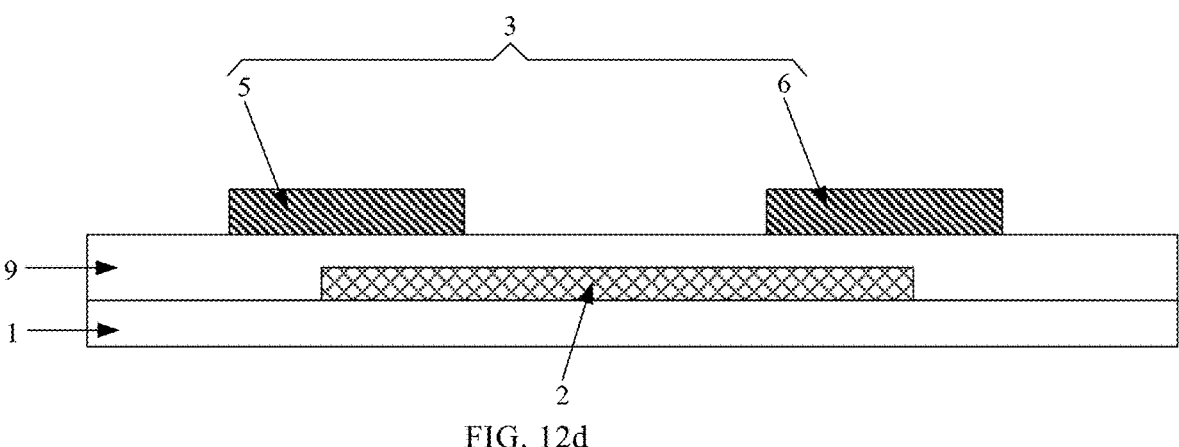
Figure 12E:
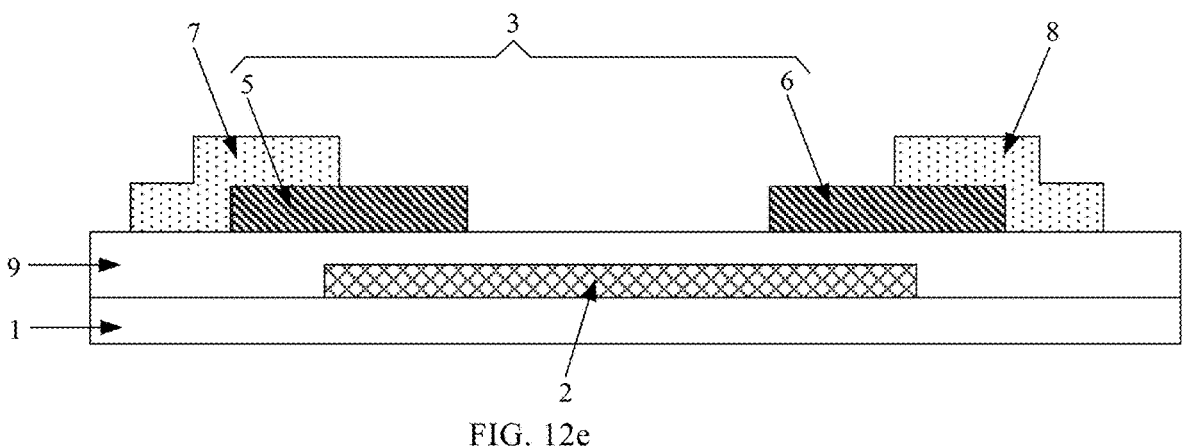
Figure 12F:
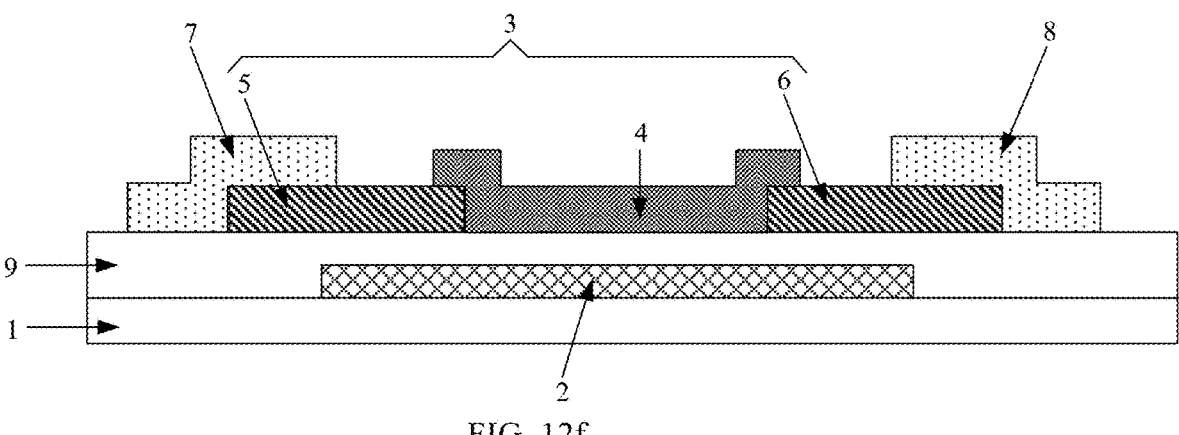

FIG. 11 is a flowchart showing a method for manufacturing a thin film transistor according to an embodiment of the present disclosure, and FIGS. 12a to 12f are schematic cross-sectional views showing intermediate products manufactured by the manufacturing method shown in FIG. 11. As shown in FIGS. 11 to 12f, the manufacturing method shown in FIG. 11 is a specific implementation of the manufacturing method shown in FIG. 10. The manufacturing method shown in FIG. 11 may be used for manufacturing the thin film transistor shown in FIG. 2b, and may include the following steps S201 to S207.

Step S201 includes providing a substrate.

Referring to FIG. 12a, the substrate 1 may be a flexible substrate (e.g., a resin substrate) or a rigid substrate (e.g., a glass substrate).

As an exemplary embodiment, the substrate 1 is a flexible substrate having a thickness in a range from about 5 nm to about 10 nm.

Step S202 includes forming a gate electrode on a side of the substrate.

Referring to FIG. 12b, the gate electrode 2 is formed on the side of the substrate 1 through a patterning process.

As an optional embodiment, the material of the gate electrode 2 is a metal nanomaterial (e.g., a metal nanowire or a metal carbon nanotube), and the pattern of the gate electrode 2 is formed by a process of ink-jet printing the metal nanomaterial, where a thickness of the metal nanomaterial is in a range from 10 nm to 15 nm.

As another optional embodiment, the material of the gate electrode 2 is a conventional metal material, and the pattern of the gate electrode 2 may be obtained by forming a metal material film and then performing a patterning process on the metal material film using a mask.

Step S203 includes forming a gate insulating layer on a side of the gate electrode distal to the substrate.

Referring to FIG. 12c, the material of the gate insulating layer 9 may be silicon oxide, silicon nitride, or a combination thereof. Optionally, the gate insulating layer 9 has a thickness in a range from 50 nm to 200 nm, and for example, of 100 nm.

In general, the thickness of the gate insulating layer 9 will have an influence on a threshold voltage and a sub-threshold region current of the TFT, and the thickness of the gate insulating layer 9 is designed to be as small as possible as long as it is ensured that the TFT does not generate electric leakage or generates a very small electric leakage.

Step S204 includes forming a first active pattern on a side of the gate insulating layer distal to the substrate.

Referring to FIG. 12d, a first semiconductor material film is formed first, and the first semiconductor material film may be made of one of a metal oxide semiconductor, low temperature polysilicon, and amorphous silicon. In a practical application, the first semiconductor material may be selected according to practical requirements, and generally, a material with a work function close to a work function of the semiconductor carbon nanotube as much as possible is adopted, such that a size of the Schottky barrier in the active layer can be effectively reduced. Then, the first semiconductor material film is patterned through a patterning process to obtain the first active sub-pattern 5 and the second active sub-pattern 6.

As an optional embodiment, the first semiconductor material is a metal oxide semiconductor, and is subjected to N-type doping.

As another optional embodiment, the first semiconductor material is low temperature polysilicon and/or amorphous silicon, and is subjected to P-type doping.

S205 includes forming a source electrode and a drain electrode on the side of the first active pattern distal to the substrate.

Referring to FIG. 12e, a source electrode 7 and a drain electrode 8 are formed on a side of the substrate 1 through a patterning process.

As an optional embodiment, the material of each of the source electrode 7 and the drain electrode 8 is a metal nanomaterial (e.g., a metal nanowire or a metal carbon nanotube), and a pattern of the source electrode 7 and the drain electrode 8 is formed by a process of ink-jet printing the metal nanomaterial.

As another optional embodiment, the material of each of the source electrode 7 and the drain electrode 8 is a conventional metal material, and the pattern of the source electrode 7 and the drain electrode 8 may be formed by forming a metal material thin film and then performing a patterning process on the metal material thin film using a mask.

Step S206 includes forming a second active pattern on the side of the first active pattern distal to the substrate.

Referring to FIG. 12f, the second active pattern 4 is formed through a patterning process.

Figure 13:
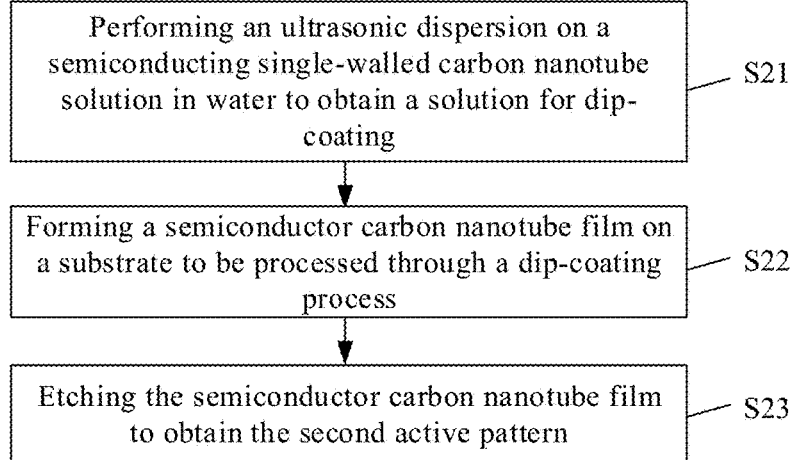
FIG. 13 is a flowchart showing an optional method for forming a second active pattern according to an embodiment of the present disclosure.

FIG. 13 is a flowchart showing an optional method for forming the second active pattern according to an embodiment of the present disclosure. As shown in FIG. 13, the forming the second active pattern may include the following steps S21 to S23.

Step S21 includes performing an ultrasonic dispersion on a semiconducting single-walled carbon nanotube solution in water to obtain a solution for dip-coating.

Step S22 includes forming a semiconductor carbon nanotube film on the substrate to be processed through a dip-coating process.

Step S23 includes etching the semiconductor carbon nanotube film to obtain the second active pattern 4.

In some embodiments, the semiconductor carbon nanotube film is etched by using an inductively coupled plasma (ICP) etching process.

In an embodiment, after forming the semiconductor carbon nanotube film and before etching the semiconductor carbon nanotube film, the method further includes: placing the substrate to be processed, on which the semiconductor carbon nanotube film is formed, in an oven for heat treatment. The heat treatment can improve an adhesion between the semiconductor carbon nanotube film and other film layers (such as the gate insulating layer 9 and the first active pattern 3 located below the semiconductor carbon nanotube film in FIGS. 2a and 2b) in contact with the semiconductor carbon nanotube film, so as to improve the reliability of the product.

Exemplarily, a solution of semiconducting single-walled carbon nanotubes (s-SWCNTs) having a concentration of 50 ug/ml is subjected to the ultrasonic dispersion in water, a semiconductor carbon nanotube film having a thickness of about 20 nm is deposited by dip-coating, then the substrate to be processed is placed in an oven to be heat-treated at 150° C. for 30 minutes, to increase the adhesion between the semiconductor carbon nanotube film and an underlying film layer, and then the semiconductor carbon nanotube film is etched by using an ICP process to form the second active pattern 4. The resultant device is then placed on a 200° C. hot plate and annealed in nitrogen atmosphere for two hours to remove water and oxygen molecules.

Alternatively, in an embodiment of the present disclosure, the second active pattern 4 made of the semiconductor carbon nanotube material may also be formed through another process, detailed description of which is omitted here.

In some embodiments, referring to FIG. 2b, the second active pattern 4 includes the first portion 401 between the first active region 502 and the second active region 602, and both ends of the first portion 401 are connected to the first active region 502 and the second active region 602, respectively.

Further optionally, the second active pattern 4 further includes the second portion 402 and the third portion 403 which are both connected to the first portion 401. The orthogonal projection of the second portion 402 on the substrate 1 overlaps the orthogonal projection of the first active region 502 on the substrate 1, and the orthogonal projection of the third portion 403 on the substrate 1 overlaps the orthogonal projection of the second active region 602 on the substrate 1.

It should be noted that in an embodiment of the present disclosure, the step of forming the source electrode 7 and the drain electrode 8 (e.g., step S205) may also be performed after the step of forming the second active pattern 4 (e.g., step S206). However, in order to prevent the process of forming the source electrode 7 and the drain electrode 8 from adversely affecting the second active pattern, it is preferable in the present embodiment that the step of forming the source electrode 7 and the drain electrode 8 is performed before the step of forming the second active pattern 4.

Step S207 includes forming a passivation layer on a side of the second active pattern distal to the substrate.

Referring to FIGS. 2a and 2b, the passivation layer 10 according to the present embodiment functions to block water and oxygen. The passivation layer 10 may be made of an organic material (e.g., a PMMA thin film, which may be formed through a spin coating process) or an inorganic material (e.g., $Al_3O_2$, which may be formed through a sputtering process).

Through the above steps S201 to S207, the TFT shown in FIGS. 2a and 2b may be manufactured.

It should be noted that the step of forming the source electrode 7 and the drain electrode 8 shown in FIG. 2b (e.g., step S205) and the step of forming the first active pattern 3 (e.g., step S204) are performed in this stated order (i.e., step S205 is performed before step S204), and in this case, the resultant new manufacturing method may be used for manufacturing the TFT shown in FIG. 7, the detailed description thereof being omitted here.

Figure 14:
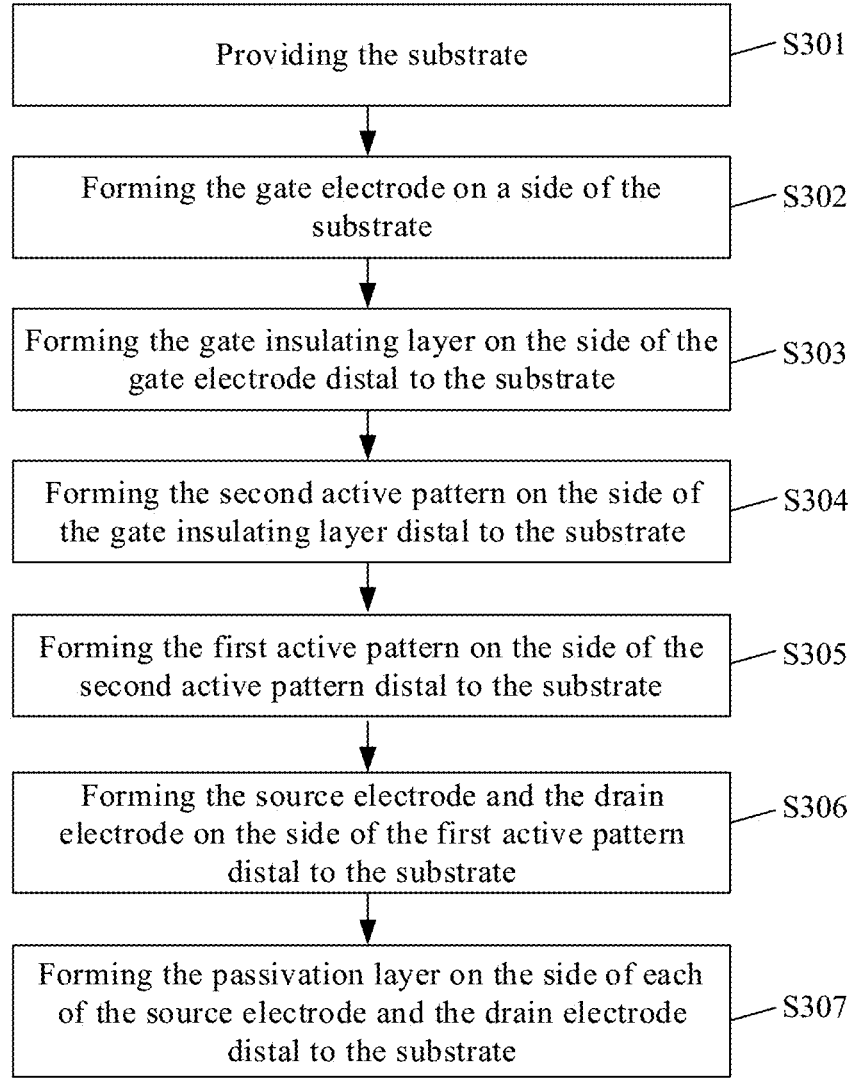
FIG. 14 is a flowchart showing a method for manufacturing a thin film transistor according to an embodiment of the present disclosure.

FIG. 14 is a flowchart showing a method for manufacturing a thin film transistor according to an embodiment of the present disclosure. As shown in FIG. 14, the manufacturing method shown in FIG. 14 may be used for manufacturing the thin film transistor shown in FIG. 6, and include the following steps S301 to S307.

Step S301 includes providing the substrate.

Step S302 includes forming the gate electrode on a side of the substrate.

Step S303 includes forming the gate insulating layer on the side of the gate electrode distal to the substrate.

Step S304 includes forming the second active pattern on the side of the gate insulating layer distal to the substrate.

Step S305 includes forming the first active pattern on the side of the second active pattern distal to the substrate.

Step S306 includes forming the source electrode and the drain electrode on the side of the first active pattern distal to the substrate.

Step S307 includes forming the passivation layer on the side of each of the source electrode and the drain electrode distal to the substrate.

Through the above steps S301 to S307, the TFT shown in FIG. 6 may be manufactured.

For the detailed description of each of step S301 to step S307, reference may be made to the detailed description of each step shown in FIG. 11, and the detailed description of each of step S301 to step S307 is omitted here.

FIG. 15 is a flowchart showing a method for manufacturing a thin film transistor according to an embodiment of the present disclosure. As shown in FIG. 15, the manufacturing method shown in FIG. 15 may be used for manufacturing the thin film transistor shown in FIG. 8, and include the following steps S401 to S407.

Step S401 includes providing the substrate.

Step S402 includes forming the first active pattern on a side of the substrate.

S403 includes forming the source electrode and the drain electrode on the side of the first active pattern distal to the substrate.

Step S404 includes forming the second active pattern on the side of the first active pattern distal to the substrate.

Step S405 includes forming the gate insulating layer on the side of the second active pattern distal to the substrate.

Step S406 includes forming the gate electrode on the side of the gate insulating layer distal to the substrate.

Step 407 includes forming the passivation layer on the side of the gate electrode distal to the substrate.

Through the above steps S401 to S407, the TFT shown in FIG. 8 may be manufactured.

For the detailed description of each of step S401 to step S407, reference may be made to the detailed description of each step in FIG. 11, which is not repeated here.

It should be noted that the step of forming the first active pattern (i.e., step S402) and the step of forming the source electrode and the drain electrode (i.e., step S403) in FIG. 15 may be performed in a reverse order, and in this case the resultant new manufacturing method may be used for manufacturing the TFT shown in FIG. 9, and detailed description thereof is omitted here.

Based on the same inventive concept, an embodiment of the present disclosure also provides a circuit, which includes at least one switch that is the thin film transistor according to any one of the foregoing embodiments.

As an example, the circuit may be applied to a display panel, and specifically, the circuit may be a pixel circuit of the display panel.

FIG. 16 is a schematic diagram of a pixel circuit according to an embodiment of the present disclosure. As shown in FIG. 16, the display panel is exemplarily a liquid crystal display panel, and a pixel circuit of the liquid crystal display panel includes a switching transistor TO and a pixel electrode. The switching transistor TO includes a control electrode connected to a gate line GATE in a corresponding row, a source electrode connected to a data line DATA, and a drain electrode connected to the pixel electrode. When a driving signal supplied from the gate line GATE is at a valid level, the switching transistor TO is turned on, and a data voltage on the data line DATA is written (e.g., provided) to the pixel electrode. The switching transistor TO may be the thin film transistor according to any one of the foregoing embodiments. In this case, the data line DATA may be disposed in the same layer as the source electrode of the thin film transistor, and the pixel electrode may be connected to the drain electrode of the thin film transistor by a through hole.

Figure 17:
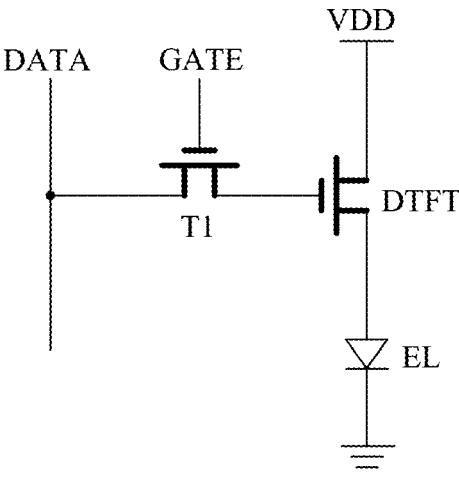
FIG. 17 is a schematic diagram of another pixel circuit according to an embodiment of the present disclosure.

FIG. 17 is a schematic diagram of another pixel circuit according to an embodiment of the present disclosure. As shown in FIG. 17, specifically, the display panel is an LED/OLED/QLED (i.e., a light-emitting diode or an organic light emitting diode or a quantum dot light emitting diode) display panel, and a pixel circuit of the display panel includes a data writing transistor T1, a driving transistor DTFT, and a light emitting element EL (which may be an LED, an OLED, or a QLED). The data writing transistor T1 includes a control electrode connected to a gate line GATE in a corresponding row, a source electrode connected to a data line DATA, and a drain electrode connected to a control electrode of the driving transistor DTFT. The driving transistor DTFT includes a source electrode connected to a power supply terminal VDD, and a drain electrode connected to the light emitting element EL. When a driving signal supplied from the gate line GATE is in a valid level state, the data writing transistor T1 is turned on, and a data voltage on the data line DATA is written (e.g., provided) to the control electrode of the driving transistor DTFT, such that the driving transistor DTFT outputs a corresponding driving signal. The data writing transistor T1 may be the thin film transistor according to any one of the foregoing embodiments. Apparently, in some embodiments, the driving transistor DTFT may also be the thin film transistor according to any one of the foregoing embodiments.

Alternatively, the circuit according to an embodiment of the present disclosure may also have other circuit structures. It will be appreciated by one of ordinary skill in the art that a circuit including the thin film transistor according to any one of the foregoing embodiments falls within the scope of the present disclosure.

It will be understood that the foregoing embodiments are merely exemplary embodiments adopted to illustrate the principles of the present disclosure, and the present disclosure is not limited thereto. It will be apparent to one of ordinary skill in the art that various modifications and improvements can be made therein without departing from the spirit and essence of the present disclosure, and such modifications and improvements are also considered to be within the scope of the present disclosure.

What is claimed is:

1. A thin film transistor, comprising:
a substrate;
a gate electrode;
an active layer comprising a first active pattern and a second active pattern, wherein the first active pattern comprises a first active sub-pattern, the first active sub-pattern comprises a first active region and a first source-drain contact region, the first source-drain contact region is connected to the second active pattern through the first active region, the first active pattern comprises a material of at least one of a metal oxide semiconductor, low-temperature polycrystalline silicon, and amorphous silicon, and the second active pattern comprises a material of a semiconductor carbon nanotube;
a source electrode and a drain electrode, which are spaced apart from each other and are respectively connected to the active layer; and
a passivation layer on a side of the second active pattern distal to the substrate,
wherein the second active pattern comprises an extension portion, the extension portion is located in a layer different from a layer where the first active region is located in a direction perpendicular to the substrate, an orthogonal projection of the extension portion on the substrate overlaps an orthogonal projection of the first active region on the substrate, and an overlapping portion of the orthogonal projections of the extension portion and the first active region is located within an orthogonal projection of the gate electrode on the substrate.

2. The thin film transistor according to claim 1, further comprising a second active sub-pattern spaced apart from the first active sub-pattern in a direction parallel to the substrate, wherein the second active sub-pattern comprises a material of at least one of a metal oxide semiconductor, low-temperature polycrystalline silicon, and amorphous silicon;
the second active sub-pattern comprises a second active region and a second source-drain contact region, the first source-drain contact region is on a side of the first active region distal to the second active sub-pattern, the second source-drain contact region is on a side of the second active region distal to the first active sub-pattern, and the second source-drain contact region is connected to the second active pattern through the second active region; and
one of the source electrode and the drain electrode is connected to the first source-drain contact region, and the other of the source electrode and the drain electrode is connected to the second source-drain contact region.

3. The thin film transistor according to claim 2, wherein the second active pattern comprises a first portion between the first active region and the second active region;
the second active pattern further comprises at least one of a second portion and a third portion which are connected to the first portion;
the second portion is the extension portion; and
an orthogonal projection of the third portion on the substrate overlaps an orthogonal projection of the second active region on the substrate.

4. The thin film transistor according to claim 2, wherein an orthogonal projection of the second active pattern on the substrate does not overlap each of an orthogonal projection of the first source-drain contact region on the substrate and an orthogonal projection of the second source-drain contact region on the substrate.

5. The thin film transistor according to claim 1, wherein the second active pattern is on a side of the first active pattern distal to the substrate.

6. The thin film transistor according to claim 1, wherein the gate electrode is between the substrate and the active layer or on a side of the active layer distal to the substrate, and the gate electrode and the active layer have a gate insulating layer therebetween; and
the source electrode and the drain electrode are on a side of the first active pattern distal to the substrate, or between the first active pattern and the substrate.

7. The thin film transistor according to claim 1, wherein one of the source electrode and the drain electrode is connected to the first source-drain contact region, and the other of the source electrode and the drain electrode is connected to the second active pattern.

8. The thin film transistor according to claim 1, wherein the substrate is a flexible substrate.

9. The thin film transistor according to claim 1, wherein the gate electrode comprises a material of a metal nanomaterial, and/or each of the source electrode and the drain electrode comprises a material of a metal nanomaterial.

10. The thin film transistor according to claim 1, wherein the semiconductor carbon nanotube has a diameter ranging from 0.8 nm to 2 nm.

11. The thin film transistor according to claim 1, wherein a hysteresis gap formed in a forward sweep and a reverse sweep performed on the thin film transistor is less than or equal to 0.2 V.

12. The thin film transistor according to claim 1, wherein a ratio of a source-drain current of the thin film transistor in a saturated turn-on state to a source-drain current of the thin film transistor in a turn-off state is greater than or equal to $10^5$.

13. A method for manufacturing the thin film transistor according to claim 1, the method comprising:

providing the substrate;

forming the gate electrode;

forming the active layer, wherein the forming the active layer comprises forming the first active pattern through a patterning process and forming the second active pattern through a patterning process;

forming the source electrode and the drain electrode; and forming the passivation layer, wherein forming the second active pattern comprises forming the extension portion of the second active pattern.

14. The method according to claim 13, wherein the forming the second active pattern through the patterning process comprises:

performing an ultrasonic dispersion on a semiconducting single-walled carbon nanotube solution in water to obtain a solution for dip-coating;

forming a semiconductor carbon nanotube film on a substrate to be processed through a dip-coating process; and etching the semiconductor carbon nanotube film to obtain the second active pattern.

15. The method according to claim 14, wherein the semiconductor carbon nanotube film is etched by using an inductively coupled plasma etching process.

16. The method according to claim 14, further comprising, after the forming the semiconductor carbon nanotube film on the substrate to be processed through the dip-coating process and before the etching the semiconductor carbon nanotube film:

placing the substrate to be processed, on which the semiconductor carbon nanotube film is formed, in an oven for heat treatment, to increase an adhesion between the semiconductor carbon nanotube film and another film in contact with the semiconductor carbon nanotube film.

17. The method according to claim 13, wherein the forming the second active pattern through the patterning process is performed after the forming the first active pattern through the patterning process.

18. The method according to claim 13, wherein the forming the gate electrode is performed before the forming the active layer, and the method further comprises, between the forming the gate electrode and the forming the active layer: forming a gate insulating layer on a side of the gate electrode distal to the substrate; or, the forming the gate electrode is performed after the forming the active layer, and the method further comprises, between the forming the active layer and the forming the gate electrode: forming a gate insulating layer on a side of the active layer distal to the substrate;

the forming the source electrode and the drain electrode is performed before or after the forming the first active pattern; and the forming the source electrode and the drain electrode is performed before the forming the second active pattern through the patterning process.

19. The method according to claim 13, wherein the substrate is a flexible substrate;

the forming the gate electrode comprises: forming a pattern of the gate electrode by a process of ink-jet printing a metal nanomaterial; and/or the forming the source electrode and the drain electrode comprises: forming a pattern of the source electrode and the drain electrode by a process of ink-jet printing a metal nanomaterial.

20. A circuit, comprising at least one switch, wherein the at least one switch is the thin film transistor according to claim 1.

* * * * *